(12) United States Patent
Park et al.

(10) Patent No.: US 12,237,253 B2
(45) Date of Patent: Feb. 25, 2025

(54) SEMICONDUCTOR PACKAGE AND METHOD FOR FABRICATING THE SAME

(71) Applicant: SAMSUNG ELECTRONICS CO., LTD., Suwon-si (KR)

(72) Inventors: Jun Hyeong Park, Hwaseong-si (KR); Jin Young Kim, Suwon-si (KR); Young Kwan Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 17/677,012

(22) Filed: Feb. 22, 2022

(65) Prior Publication Data

US 2022/0384325 A1    Dec. 1, 2022

(30) Foreign Application Priority Data

May 26, 2021    (KR) .................. 10-2021-0067354

(51) Int. Cl.
*H01L 23/498*    (2006.01)
*H01L 21/48*    (2006.01)
(Continued)

(52) U.S. Cl.
CPC .... *H01L 23/49822* (2013.01); *H01L 21/4857* (2013.01); *H01L 23/49816* (2013.01); *H01L 23/49833* (2013.01); *H01L 23/49838* (2013.01); *H01L 25/0655* (2013.01); *H01L 25/0657* (2013.01); *H01L 24/16* (2013.01); *H01L 24/32* (2013.01); *H01L 24/73* (2013.01);
(Continued)

(58) Field of Classification Search
CPC .......... H01L 21/4857; H01L 23/49816; H01L 23/49822; H01L 23/49833; H01L 23/49838; H01L 24/32; H01L 25/0655; H01L 25/0657; H01L 2225/06513; H01L 2225/06517; H01L 2225/06524; H01L 2225/06541; H01L 2225/06548
USPC ........................................ 257/690
See application file for complete search history.

(56) References Cited

U.S. PATENT DOCUMENTS 6,806,577 B2    10/2004    Juengling et al.
7,745,736 B2    6/2010    Ogawa et al.
(Continued)

FOREIGN PATENT DOCUMENTS

JP    2000-100820 A    4/2000
JP    4615846 B2    1/2011

*Primary Examiner* — Jasmine J Clark
(74) *Attorney, Agent, or Firm* — Muir Patent Law, PLLC

(57) ABSTRACT

A semiconductor package includes an interposer having a pad insulating film, a first lower pad exposed from a lower surface of the pad insulating film, the first lower pad including a first extension and a second extension spaced apart from each other and extending side by side in a first direction, and a first connection extending in a second direction intersecting the first direction and connecting the first extension and the second extension, and a redistribution structure that covers an upper surface of the pad insulating film, first interposer bumps on a lower surface of the interposer and spaced apart from each other, at least a part of each of the first and second extensions being connected to one of the first interposer bumps, and a first semiconductor chip on an upper surface of the interposer and electrically connected to the redistribution structure.

20 Claims, 26 Drawing Sheets

(51) Int. Cl.
    *H01L 23/00*         (2006.01)
    *H01L 25/065*      (2023.01)

(52) U.S. Cl.
    CPC .............. *H01L 2224/16147* (2013.01); *H01L 2224/16227* (2013.01); *H01L 2224/16237* (2013.01); *H01L 2224/32145* (2013.01); *H01L 2224/32225* (2013.01); *H01L 2224/73204* (2013.01); *H01L 2225/06513* (2013.01); *H01L 2225/06517* (2013.01); *H01L 2225/06524* (2013.01); *H01L 2225/06541* (2013.01); *H01L 2225/06548* (2013.01); *H01L 2225/06568* (2013.01); *H01L 2924/1431* (2013.01); *H01L 2924/1434* (2013.01)

(56) References Cited

U.S. PATENT DOCUMENTS

| | | |
|---|---|---|
| 8,242,583 B2 | 8/2012 | Yune et al. |
| 8,659,122 B2 | 2/2014 | Matsumura |
| 8,669,661 B2 | 3/2014 | Yao et al. |
| 10,276,382 B2 | 4/2019 | Hunt et al. |
| 10,319,681 B2 | 6/2019 | Hsieh et al. |
| 10,333,193 B2 | 6/2019 | Park et al. |
| 10,756,019 B1 | 8/2020 | Wu et al. |
| 2009/0296330 A1 | 12/2009 | Ho et al. |
| 2019/0103353 A1* | 4/2019 | Liu .................... H01L 25/0655 |
| 2021/0066231 A1 | 3/2021 | Cho et al. |

\* cited by examiner

SEMICONDUCTOR PACKAGE AND METHOD FOR FABRICATING THE SAME

CROSS-REFERENCE TO RELATED APPLICATION

This application claims priority from Korean Patent Application No. 10-2021-0067354, filed on May 26, 2021, in the Korean Intellectual Property Office, and all the benefits accruing therefrom under 35 U.S.C. 119, the contents of which in its entirety are herein incorporated by reference.

BACKGROUND

1. Field

Embodiments relate to a semiconductor package and a method for fabricating the same. More specifically, embodiments relate to a semiconductor package including an interposer and a method for fabricating the same.

2. Description of the Related Art

An interposer market is growing due to high specifications of set and adoption of high bandwidth memory (HBM). For example, a semiconductor package with an interposer may be fabricated by surface-mounting a semiconductor chip on the interposer and molding the mounted semiconductor chip with a molding material.

SUMMARY

According to some aspects of the present disclosure, there is provided a semiconductor package including an interposer which has a pad insulating film, a first lower pad exposed from a lower surface of the pad insulating film, and a redistribution structure that covers an upper surface of the pad insulating film, a plurality of first interposer bumps spaced apart from each other, on a lower surface of the interposer, and a first semiconductor chip which is electrically connected to the redistribution structure, on an upper surface of the interposer, wherein the first lower pad includes a first extension and a second extension spaced apart from each other and extending side by side in a first direction, and a first connection which extends in a second direction intersecting the first direction and connects the first extension and the second extension, and at least a part of the first extension and at least a part of the second extension are connected to one of the plurality of first interposer bumps.

According to some aspects of the present disclosure, there is provided a semiconductor package including an interposer which has a pad insulating film, a first lower pad exposed from a lower surface of the pad insulating film, and a first redistribution pattern extending along an upper surface of the pad insulating film, and a first semiconductor chip which is mounted on an upper surface of the interposer, wherein the first lower pad includes a first extension and a second extension spaced apart from each other and extending side by side in a first direction, and a first connection which extends in a second direction intersecting the first direction and connects the first extension and the second extension, and wherein a width of each of the first extension and the second extension is 2 um to 5 um, and a spaced distance between the first extension and the second extension is 2 um to 5 um.

According to some aspects of the present disclosure, there is provided a semiconductor package including a package substrate which has an insulating core, and a substrate pad exposed from an upper surface of the insulating core, an interposer which includes a redistribution structure on an upper surface of the package substrate, a first lower pad exposed from a lower surface of the redistribution structure, and an upper pad exposed from an upper surface of the redistribution structure, a first interposer bump which connects the substrate pad and the first lower pad between the package substrate and the interposer, a first semiconductor chip and a second semiconductor chip including a chip pad exposed from a lower surface thereof, on an upper surface of the interposer, and a chip bump which connects the upper pad and the chip pad, between the interposer and the first semiconductor chip, and between the interposer and the second semiconductor chip, wherein the first lower pad includes a first extension and a second extension which are spaced apart from each other and extend side by side in a first direction, and a first connection which extends in a second direction intersecting the first direction and connects the first extension and the second extension, and the first interposer bump is in contact with at least a part of the first extension and at least a part of the second extension.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
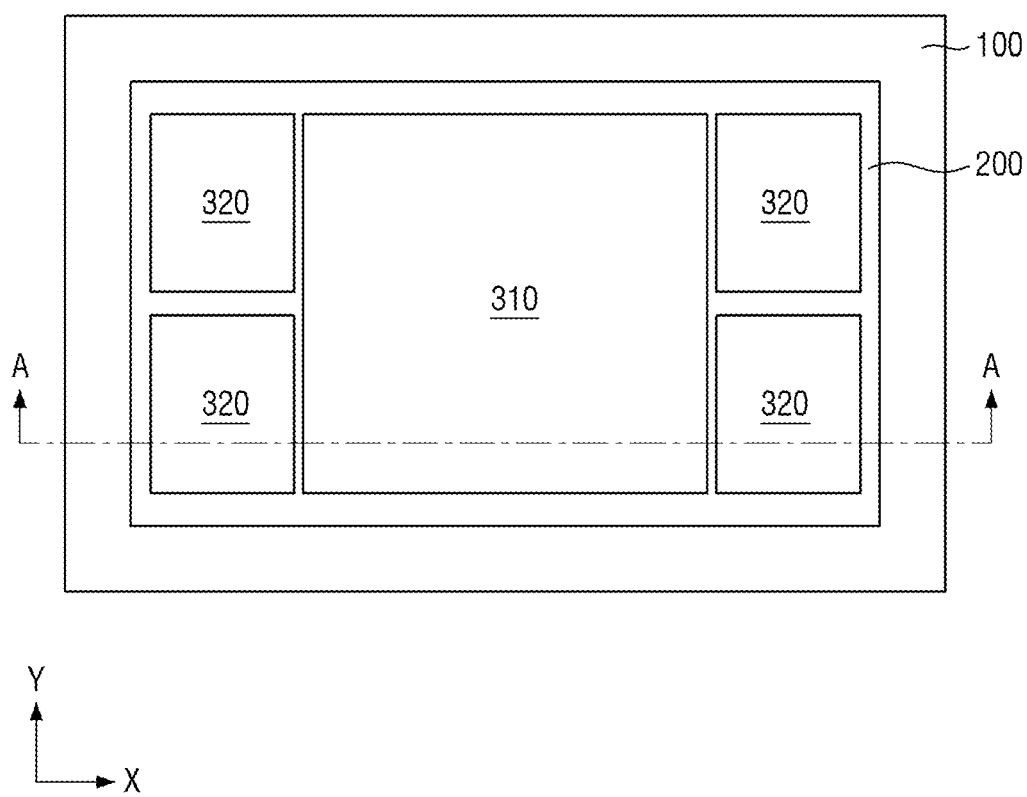
FIG. 1 is an exemplary layout diagram of a semiconductor package according to some embodiments.
Figure 2:
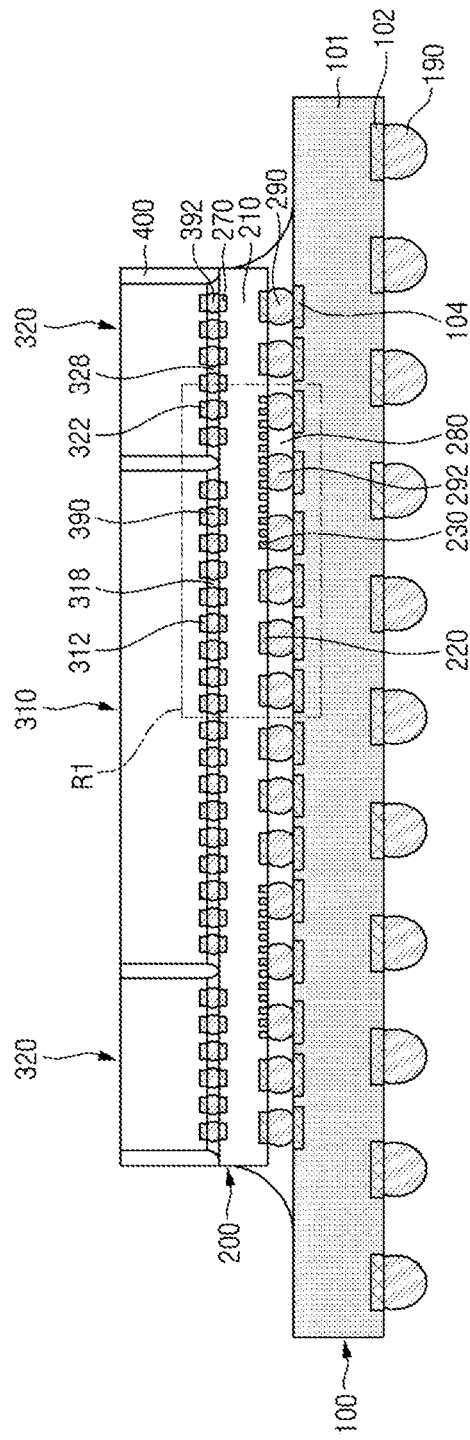
FIG. 2 is a schematic cross-sectional view taken along line A-A of FIG. 1.
Figure 3:
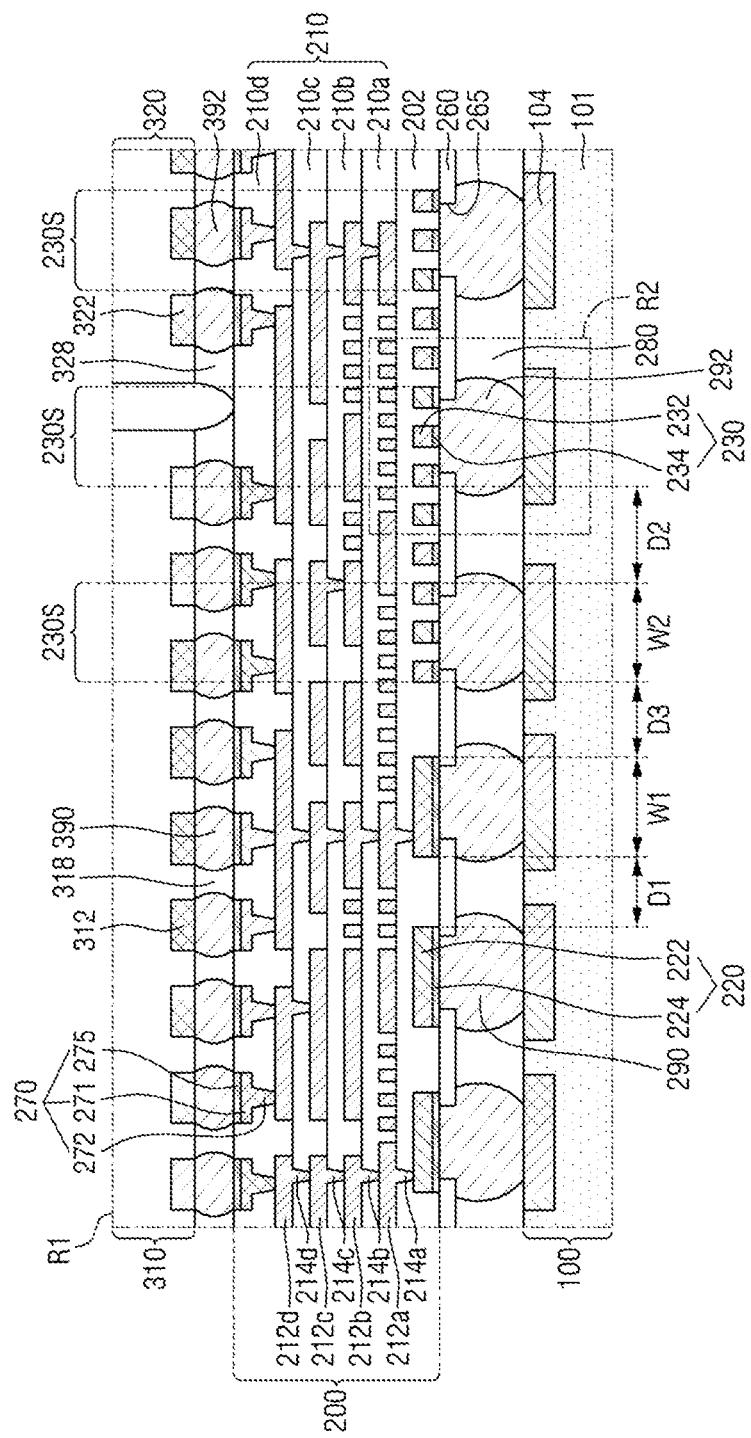
FIG. 3 is an enlarged view of region R1 of FIG. 2.
Figure 4:
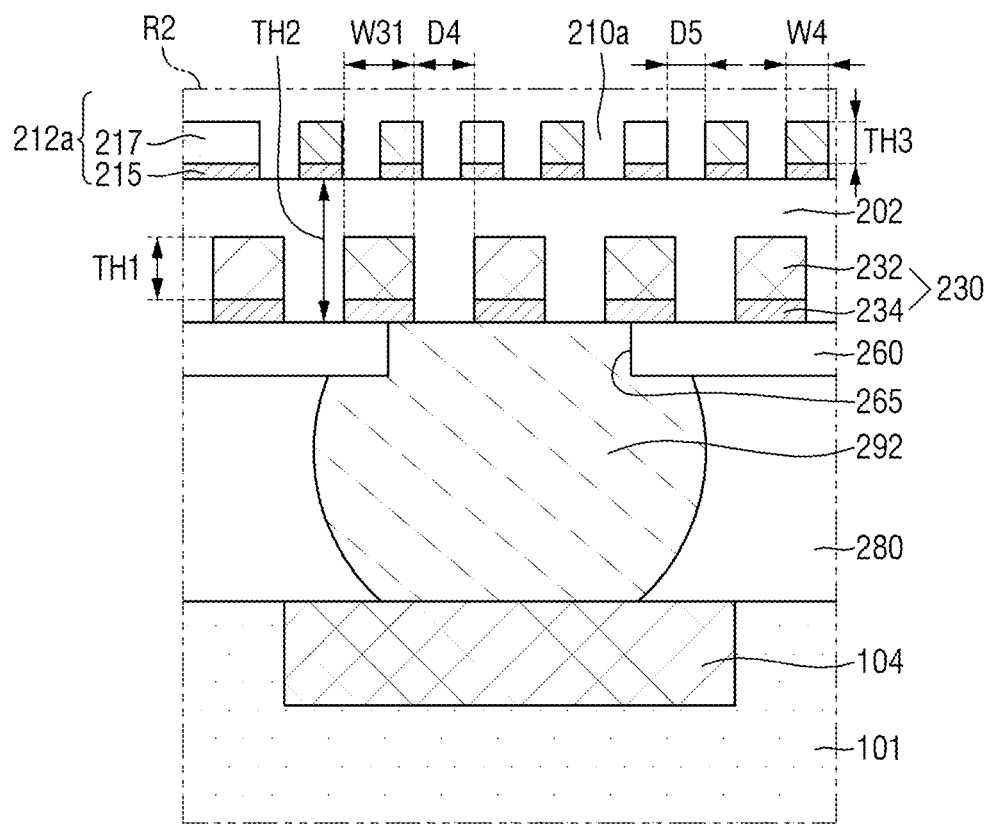
FIG. 4 is an enlarged view of region R2 of FIG. 3.

FIG. 1 is an exemplary layout diagram of a semiconductor package according to some embodiments. FIG. 2 is a cross-sectional view along line A-A of FIG. 1. FIG. 3 is an enlarged view of region R1 of FIG. 2. FIG. 4 is an enlarged view of region R2 of FIG. 3. FIGS. 5A to 5D are various layout diagrams of region R1 of FIG. 2.

Referring to FIGS. 1 to 5A, a semiconductor packages according to some embodiments may include a package substrate 100, an interposer 200, a first semiconductor chip 310, a second semiconductor chip 320, and a molding member 400.

The package substrate 100 may be a substrate for a semiconductor package. As an example, the package substrate 100 may be a printed circuit board (PCB). The package substrate 100 may include a lower side and an upper side that are opposite to each other.

The package substrate 100 may include an insulating core 101, a first substrate pad 102 and a second substrate pad 104. The first substrate pad 102 and the second substrate pad 104 may be used to electrically connect the package substrate 100 to other components, respectively. For example, the first substrate pad 102 may be exposed from a lower surface of the insulating core 101, and the second substrate pad 104 may be exposed from an upper surface of the insulating core 101. For example, the first substrate pad 102 and the second substrate pad 104 may include metallic substances, e.g., copper (Cu) or aluminum (Al).

Wiring patterns for electrically connecting the first substrate pad 102 and the second substrate pad 104 may be formed inside the insulating core 101. Although the insulating core 101 is shown as a single layer, this is only for convenience of explanation. For example, the insulating core 101 may include multiple layers, and multi-layered wiring patterns may be formed inside the insulating core 101.

The package substrate 100 may be mounted on a motherboard or the like of an electronic device. For example, a substrate bump 190 connected to the first substrate pad 102 may be formed. The package substrate 100 may be mounted on the motherboard or the like of the electronic device through the substrate bump 190. The package substrate 100 may be, e.g., a BGA (Ball Grid Array substrate).

The substrate bump 190 may be, e.g., a solder bump. The substrate bump 190 may have various shapes, e.g., a land, a ball, a pin, and a pillar. The number, interval, arrangement form, and the like of the substrate bump 190 are not limited to those shown in the drawings, and may be formed depending on the various designs.

The interposer 200 may be placed on the upper side of the package substrate 100. The interposer 200 may be, e.g., a silicon interposer or an organic interposer. The interposer 200 may include an upper surface and a lower surface that are opposite to each other. The lower surface of the interposer 200 may face the upper surface of the package substrate 100. The interposer 200 may be used to facilitate the connection between the package substrate 100 and the semiconductor chips 310 and 320 to be described later and to reduce the warpage of the package substrate 100.

The interposer 200 may include a redistribution structure 210, a first lower pad 230, a second lower pad 220, and an upper pad 270. The first lower pad 230, the second lower pad 220, and the upper pad 270 may each be used to electrically connect the interposer 200 to other components. For example, as shown in FIG. 2, the first lower pad 230 and the second lower pad 220 may each be exposed from the lower surface of the redistribution structure 210, and the upper pad 270 may be exposed from the upper surface of the redistribution structure 210. For example, the first lower pad 230, the second lower pad 220, and the upper pad 270 may include metallic substances e.g., copper (Cu) or aluminum (Al).

The interposer 200 may be mounted on the upper side of the package substrate 100. For example, a first interposer bump 292 and a second interposer bump 290 may be formed between the package substrate 100 and the interposer 200. The first interposer bump 292 may connect some of the plurality of second substrate pads 104 to the first lower pad 230, and the second interposer bump 290 may connect some others of the plurality of second substrate pads 104 to the second lower pad 220. The package substrate 100 and the interposer 200 may be electrically connected accordingly.

In some embodiments, the first lower pad 230 and the second lower pad 220 may be formed at the same level. As used herein, the term "same level" means formation by the same fabricating process. For example, the first lower pad 230 and the second lower pad 220 may have the same material composition as each other. In some embodiments, the first interposer bump 292 and the second interposer bump 290 may be formed at the same level.

The first interposer bump 292 and the second interposer bump 290 may each be solder bumps including a low melting point metal, e.g., tin (Sn), tin (Sn) alloys or the like. The first interposer bump 292 and the second interposer bump 290 may each have various shapes, e.g., a land, a ball, a pin, and a pillar. The first interposer bump 292 and the second interposer bump 290 may be formed of a single layer or multiple layers, respectively. As an example, if each of the first interposer bump 292 and the second interposer bump 290 is formed of a single layer, the single layer may include tin-silver (Sn—Ag) solder or copper (Cu). As another example, when each of the first interposer bumps 292 and the second interposer bumps 290 is formed of multiple layers, the multiple layers are made of a copper pillar (Cu pillar) and a solder. The number, interval, arrangement form, and the like of the first interposer bumps 292 and the second interposer bumps 290 are not limited to those shown in the drawings and may depend on various designs.

In some embodiments, a first underfill 280 may be formed between the package substrate 100 and the interposer 200. The first underfill 280 may fill a space between the package substrate 100 and the interposer 200. Further, the first underfill 280 may cover the first interposer bump 292 and the second interposer bump 290. The first underfill 280 may prevent a breakage or the like of the interposer 200, by fixing the interposer 200 onto the package substrate 100. For example, the first underfill 280 may include an insulating polymeric material, e.g., an EMC (epoxy molding compound).

As shown in FIG. 3, the redistribution structure 210 may include a plurality of sequentially stacked redistribution layers (e.g., first to fourth redistribution layers). The redistribution structure 210 may electrically connect the first lower pad 230 and/or the second lower pad 220 and the upper pad 270 through the plurality of redistribution layers.

In detail, each redistribution layer may include redistribution insulating films 210a to 210d, redistribution patterns 212a to 212d, and redistribution plugs 214a to 214d. The redistribution insulating films 210a to 210d may cover the redistribution patterns 212a to 212d. For example, a first redistribution pattern 212a may be formed on the first lower pad 230 and the second lower pad 220. The first redistribution insulating film 210a may cover the first redistribution pattern 212a. The redistribution plugs 214a to 214d may interconnect the redistribution patterns 212a to 212d placed at different levels from each other. For example, a second redistribution pattern 212b extending along the upper surface of the first redistribution insulating film 210a may be formed. The second redistribution plug 214b may penetrate the first redistribution insulating film 210a to connect the first redistribution pattern 212a and the second redistribution pattern 212b.

Each redistribution layer may perform various functions depending on the design of the layer. For example, the redistribution patterns 212a to 212d may include signal patterns, ground patterns, power patterns, and the like. Here, the ground patterns may transmit and receive a ground signal GND, and the power patterns may transmit and receive a power signal PWR. The signal patterns may transmit and receive various signals (e.g., data signals) except the ground signal and the power signal.

The second lower pad 220 may be connected to the redistribution patterns 212a to 212d. For example, the first redistribution plug 214a may penetrate a pad insulating film 202 to connect the second lower pad 220 and the first redistribution pattern 212a. Therefore, the second lower pad 220 may be electrically connected to the redistribution structure 210 and may transmit and receive data signals, ground signals or power signals. In an embodiment, the second lower pad 220 may be a signal pad that transmits and receives data signals, ground signals or power signals.

In some embodiments, the first lower pad 230 may not be connected to the redistribution patterns 212a to 212d. For example, the first lower pad 230 may not be connected to the first redistribution plug 214a, e.g., the first lower pad 230 may be completely covered by the pad insulating film 202. That is, the first lower pad 230 may not be electrically connected to the redistribution structure 210. In an embodiment, the first lower pad 230 may be a dummy pad that does not transmit or receive data signals, ground signals or power signals. In another embodiment, the first lower pad 230 may be a ground pad that transmits and receives the ground signals.

In some embodiments, the pad insulating film 202 may be formed on the lower surface of the redistribution structure 210. For example, as shown in FIG. 3, the first redistribution pattern 212a may extend along the upper surface of the pad insulating film 202. The first lower pad 230 and the second lower pad 220 may be formed inside the pad insulating film 202, respectively. Further, the first lower pad 230 and the second lower pad 220 may be exposed from the lower surface of the pad insulating film 202, respectively. For example, the pad insulating film 202 may include a photosensitive insulating material, e.g., a PID (photoimageable dielectric).

In some embodiments, a passivation film 260 may be formed on the lower surface of the pad insulating film 202. The passivation film 260 may expose at least a part of the first lower pad 230 and/or at least a part of the second lower pad 220. For example, the passivation film 260 may include an opening 265 that exposes at least a part of the first lower pad 230 and/or at least a part of the second lower pad 220. Through the opening 265, the first interposer bump 292 may be connected to the first lower pad 230 and the second interposer bump 290 may be connected to the second lower pad 220. For example, the passivation film 260 may include a thermosetting resin, e.g., an epoxy resin, a thermoplastic resin, e.g., polyimide, or a photosensitive insulating material, e.g., a PID.

In some embodiments, each of the first lower pad 230 and the second lower pad 220 may include first seed patterns 224 and 234 and first metal patterns 222 and 232. The first seed patterns 224 and 234 and the first metal patterns 222 and 232 may be sequentially stacked on the passivation film 260.

The first metal patterns 222 and 232 may include conductive materials, e.g., copper (Cu), aluminum (Al), silver (Ag), tin (Sn), gold (Au), nickel (Ni), lead (Pb), titanium (Ti) or alloys thereof. For example, the first metal patterns 222 and 232 may include copper (Cu). The first seed patterns 224 and 234 may serve as a seed for the formation of the first metal patterns 222 and 232. For example, the first seed patterns 224 and 234 may include copper (Cu). In some embodiments, the first seed patterns 224 and 234 may be formed of multiple layers. As an example, the first seed patterns 224 and 234 may be formed of a double layer of titanium (Ti)/copper (Cu).

In some embodiments, each of the redistribution patterns 212a to 212d may include a second seed pattern 215 and a second metal pattern 217. The second seed pattern 215 and the second metal pattern 217 may be sequentially stacked on the redistribution insulating films 210a to 210d. For example, as shown in FIG. 4, the first redistribution pattern 212a may include a second seed pattern 215 and a second metal pattern 217 that are sequentially stacked on the first redistribution insulating film 210a.

The second metal pattern 217 may include conductive materials, e.g., copper (Cu), aluminum (Al), silver (Ag), tin (Sn), gold (Au), nickel (Ni), lead (Pb), titanium (Ti) or alloys thereof. For example, the second metal pattern 217 may include copper (Cu). The second seed pattern 215 may serve as a seed for the formation of the second metal pattern 217. For example, the second seed pattern 215 may include copper (Cu).

In some embodiments, the thickness of each of the first lower pad 230 and the second lower pad 220 may be greater than the thickness of the first redistribution pattern 212a, e.g., the thicknesses of the first lower pad 230 and the second lower pad 220 may be equal to each other. For example, as illustrated in FIG. 4, a thickness TH1 of the first metal patterns 232 may be greater than a thickness TH3 of the second metal pattern 217, e.g., along a direction normal to a bottom of the package substrate 100. This may be attributed to the fact that a part of the first lower pad 230 may be lost in the process of forming the first interposer bump 292 and the second interposer bump 290. The thickness TH1 of the first metal patterns 222 and 232, e.g., thicknesses of the first metal patterns 222 and 232 may be equal to each other, may be about 5 μm or more, e.g., the thickness TH1 may be about 8 μm to about 10 μm. For example, as further illustrated in FIG. 4, a thickness TH2 of the pad insulating film 202 may be larger than the thickness TH1 of the first metal patterns 222 and 232 to extend above and completely cover tops of the first metal patterns 222 and 232.

The plurality of second lower pads 220 may be spaced apart from each other and exposed from the lower surface of the interposer 200. A second interposer bump 290 may be placed on each second lower pad 220. That is, the plurality of second interposer bumps 290 may be placed to correspond to the second lower pad 220. The second interposer bump 290 may electrically connect the second substrate pad 104 and the second lower pad 220 accordingly. In some embodiments, the second lower pad 220 may include copper (Cu).

The first lower pad 230 may be formed in a bent line shape (e.g., a snake shape) from a planar viewpoint. For example, as shown in FIG. 5A, the first lower pad 230 may include a plurality of extensions (e.g., first to fourth extensions 232a, 232b, 232c and 232d) and a plurality of connections (e.g., first to third connections 234a, 234b and 234c) connected to define the bent line shape (e.g., a snake shape).

Figure 5A:
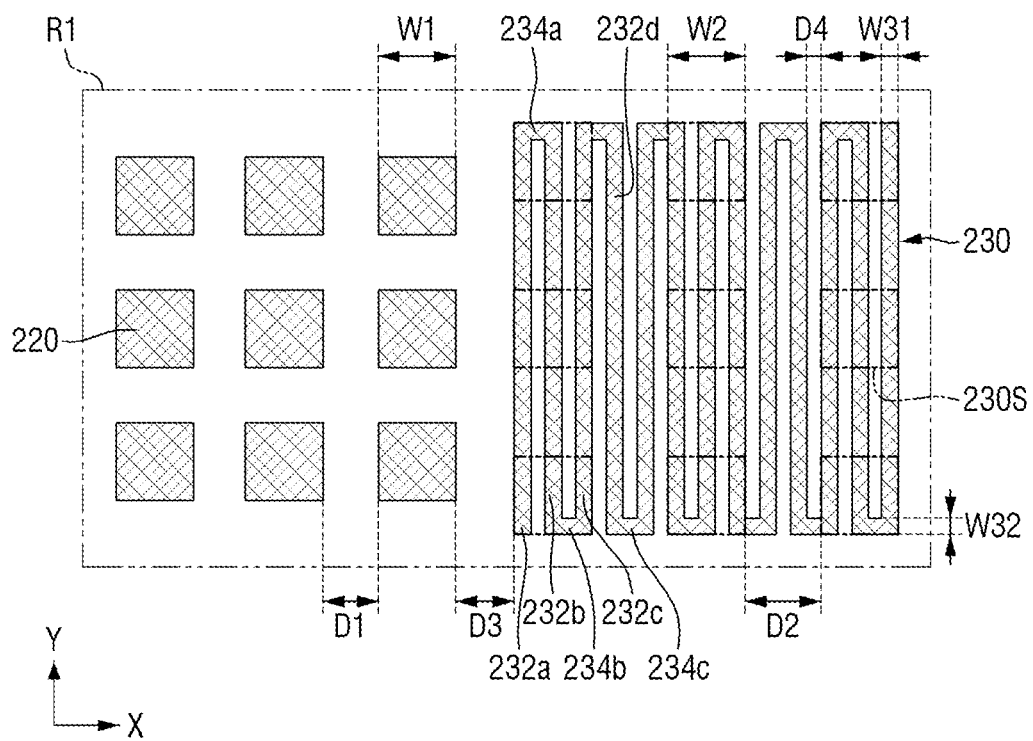
FIGS. 5A to 5D are various layout diagrams of region R1 of FIG. 2.

In detail, referring to FIG. 5A, the first to fourth extensions 232a, 232b, 232c and 232d may be spaced apart from each other and extend side by side in a first direction Y. In other words, the first to fourth extensions 232a, 232b, 232c and 232d may extend in the first direction Y, and may be spaced apart from each other in a second direction X. The first to third connections 234a, 234b and 234c may each extend in the second direction X, which intersects the first direction Y, and may interconnect the first to fourth extensions 232a, 232b, 232c and 232d. Here, the first direction Y and the second direction X are directions parallel to the lower surface of the interposer 200, respectively. As an example, the first connection 234a may connect the first extension 232a and the second extension 232b, and the second connection 234b may connect the second extension 232b and the third extension 232c.

In some embodiments, the first connection 234a may extend from one end of the second extension 232b, and the second connection 234b may extend from the other end of the second extension 232b. Accordingly, the first lower pad 230 may continuously extend in the bent line shape (e.g., a snake shape).

In some embodiments, the first connection 234a and the second connection 234b may not overlap in the second direction X. In some embodiments, the second connection 234b and the third connection 234c may overlap in the second direction X. For example, the lengths of the first to fourth extensions 232a, 232b, 232c and 232d extending in the first direction Y may be the same as each other. As used herein, the term "same" means not only exactly the same, but also minute differences that may occur due to process margins and the like.

As further illustrated in FIGS. 3 and 5A, the lower surface of the interposer 200 may include a plurality of pad regions 230S that are spaced apart from each other (e.g., dashed square regions spaced apart from each other over the first lower pad 230 in FIG. 5A). Each pad region 230S may refer to a region in which the first interposer bump 292 is placed. That is, the plurality of first interposer bumps 292 may be placed to correspond to the pad region 230S, e.g., one-to-one correspondence. At least a part of the first lower pad 230 may overlap each pad region 230S. Here, the overlap means an overlap in a direction that intersects the first direction Y and the second direction X (e.g., a vertical direction that intersects the lower surface of the interposer 200). The first interposer bump 292 may electrically connect the second substrate pad 104 and the first lower pad 230 accordingly. In some embodiments, the first lower pad 230 may include copper (Cu).

In some embodiments, the width W2, e.g., along the second direction X, of each pad region 230S may be the same as the width W1, e.g., along the second direction X, of each second lower pad 220. Here, the width means a width in a direction parallel to the lower surface of the interposer 200 (e.g., the second direction X). The width W1 of each second lower pad 220 and the width W2 of each pad region 230S may be, e.g., about 5 μm or more. As an example, the width W1 of each second lower pad 220 and the width W2 of each pad region 230S may be about 10 μm to about 30 μm.

In some embodiments, a spaced distance D2 between the pad regions 230S, e.g., along the second direction X, may be greater than a spaced distance D1 between the second lower pads 220, e.g., along the second direction D1. The spaced distance D2 between the pad regions 230S may be, e.g., about 5 μm or more. As an example, the spaced distance D2 between the pad regions 230S may be about 10 μm to about 30 μm.

In some embodiments, a distance D3 of the pad regions 230S spaced apart from the second lower pad 220 may be smaller than the spaced distance D2 between adjacent ones of the pad regions 230S, e.g., the distance D3 may be a distance along the second direction X between outermost facing edges of the pad regions 230S and the corresponding second lower pads 220. Although the distance D3 of the pad regions 230S spaced apart from the second lower pad 220 is shown as being greater than the spaced distance D1 between adjacent ones of the second lower pads 220, this is only an example.

In some embodiments, each pad region 230S may overlap a plurality of extensions among the extensions (e.g., first to fourth extensions 232a, 232b, 232c and 232d). For example, one of the pad regions 230S (e.g., a pad region 230S placed on the left side in FIG. 5A) may overlap a part of the first extension 232a, a part of the second extension 232b, and a part of the third extension 232c. Accordingly, each first interposer bump 292 may be connected to a plurality of extensions among the extensions (e.g., the first to fourth extensions 232a, 232b, 232c and 232d). For example, each first interposer bump 292 may be connected to three extensions (e.g., first to third extensions 232a, 232b and 232c).

In some embodiments, at least a part of the pad regions 230S may overlap at least a part of the connections (e.g., first to third connections 234a, 234b and 234c). For example, one of the pad regions 230S (e.g., a pad region 230S located on the left upper end in FIG. 5A) may overlap the first connection 234a.

In some embodiments, some of the extensions (e.g., first to fourth extensions 232a, 232b, 232c and 232d) and the connections (e.g., first to third connections 234a, 234b and 234c) may not overlap the pad regions 230S. For example, the fourth extension 232d and the third connection 234c may not overlap the pad regions 230S.

In some embodiments, a widths W31 of each extension (e.g., first to fourth extensions 232a, 232b, 232c and 232d) may be identical to each other. Here, the width W31 refers to a width in a direction (e.g., the second direction X) which intersects a length direction (e.g., the first direction Y) of each extension. The width W31 of each of the first to fourth extensions 232a, 232b, 232c and 232d may be, e.g., about 5 μm or less. As an example, the width W31 of each of the first to fourth extensions 232a, 232b, 232c and 232d may be about 2 μm to about 5 μm.

In some embodiments, a spaced distance D4 between the respective extensions (e.g., first to fourth extensions 232a, 232b, 232c and 232d) may be identical to each other. The spaced distance D4 between the first to fourth extensions 232a, 232b, 232c and 232d may be, e.g., about 5 μm or less. As an example, the spaced distance D4 between the first to fourth extensions 232a, 232b, 232c and 232d may be about 2 μm to about 5 μm. In some embodiments, the spaced distance D4 between the respective extensions (e.g., first to fourth extensions 232a, 232b, 232c and 232d) may be the same as the width W31 of the respective extensions (e.g., first to fourth extensions 232a, 232b, 232c and 232d).

In some embodiments, a width W32 of each connection (e.g., first to third connections 234a, 234b and 234c) may be the same as the width W31 of each extension (e.g., first to fourth extensions 232a, 232b, 232c and 232d). Here, the width W32 refers to a width in a direction (e.g., the first direction Y) that intersects the length direction (e.g., the second direction X) of each connection.

In some embodiments, a width W4 of the first redistribution pattern 212a may be smaller than the width W31 of each extension (e.g., first to fourth extensions 232a, 232b, 232c and 232d). The width W4 of the first redistribution pattern 212a may be, e.g., about 2 μm or less. As an example, the width W4 of the first redistribution pattern 212a may be about 1 μm to about 2 μm.

In some embodiments, a spaced distance D5 between the first redistribution patterns 212a may be smaller than the spaced distance D4 between the respective extensions (e.g., first to fourth extensions 232a, 232b, 232c and 232d). The spaced distance D5 between the first redistribution patterns 212a may be, e.g., about 2 μm or less. As an example, the spaced distance D5 between the first redistribution patterns 212a may be about 1 μm to about 2 μm.

The first semiconductor chip 310 and the second semiconductor chip 320 may be spaced apart from each other and placed on the upper surface of the interposer 200. The first semiconductor chip 310 and the second semiconductor chip 320 may be integrated circuits (IC) in which hundreds to millions or more of semiconductor elements are integrated in a single chip, respectively.

In some embodiments, the first semiconductor chip 310 may be a logic semiconductor chip. For example, the first semiconductor chip 310 may be an application processor (AP), e.g., a CPU (Central Processing Unit), a GPU (Graphic Processing Unit), a FPGA (Field-Programmable Gate Array), a digital signal processor, an encryption processor, a microprocessor, a microprocessor, and/or an ASIC (Application-Specific IC).

In some embodiments, the second semiconductor chip 320 may be a memory semiconductor chip. For example, the second semiconductor chip 320 may be a volatile memory, e.g., a DRAM (Dynamic Random Access Memory) or a SRAM (Static Random Access Memory), or may be a non-volatile memory, e.g., a flash memory, a PRAM (Phase-change Random Access Memory), a MRAM (Magnetoresistive Random Access Memory), a FeRAM (Ferroelectric Random Access Memory) or a RRAM (Resistive Random Access Memory).

As an example, the first semiconductor chip 310 may be an ASIC, e.g., a GPU, and the second semiconductor chip 320 may be a stack memory, e.g., a high bandwidth memory (HBM). Such a stack memory may have a form in which a plurality of ICs are stacked. The stacked ICs may be electrically connected to each other through a TSV (Through Silicon Via) or the like.

In some embodiments, a larger number of second semiconductor chips 320 may be placed than the first semiconductor chip 310. For example, a plurality of second semiconductor chips 320 may be placed around a single first semiconductor chip 310. As an example, as shown in FIG. 1, two second semiconductor chips 320 may be placed on each of two opposite sides of the first semiconductor chip 310.

The first semiconductor chip 310 may include a first chip pad 312. The first chip pad 312 may be used to electrically connect the first semiconductor chip 310 to other components. For example, the first chip pad 312 may be exposed from the lower surface of the first semiconductor chip 310.

The second semiconductor chip 320 may include a second chip pad 322. The second chip pad 322 may be used to electrically connect the second semiconductor chip 320 to other components. For example, the second chip pad 322 may be exposed from the lower surface of the second semiconductor chip 320. For example, the first chip pad 312 and the second chip pad 322 may include metallic materials, e.g., copper (Cu) or aluminum (Al), respectively.

The first semiconductor chip 310 and the second semiconductor chip 320 may be mounted on the upper surface of the interposer 200. In some embodiments, a first chip bump 390 may be formed between the interposer 200 and the first semiconductor chip 310, and a second chip bump 392 may be formed between the interposer 200 and the second semiconductor chip 320. The first chip bump 390 may connect some of the plurality of upper pads 270 to the first chip pad 312. The second chip bump 392 may connect some other of the plurality of upper pads 270 to the second chip pad 322. The first semiconductor chip 310 and the second semiconductor chip 320 may each be electrically connected to the interposer 200 accordingly.

For example, the first chip bump 390 and the second chip bump 392 may be micro bumps including low melting point metals, e.g., tin (Sn) and tin (Sn) alloys. The first chip bump 390 and the second chip bump 392 may have various shapes, e.g., a land, a ball, a pin, and a pillar, respectively. The first chip bump 390 and the second chip bump 392 may include, e.g., a UBM (Under Bump Metallurgy), respectively. In some embodiments, the first chip bump 390 and the second chip bump 392 may be formed at the same level.

In some embodiments, the upper pad 270 may include a pad layer 271, a pad plug 272, and a surface treatment layer 275. The pad plug 272 may penetrate a fourth redistribution insulating film 210d and connect the fourth redistribution pattern 212d and the pad layer 271. The surface treatment layer 275 may be interposed between the pad layer 271 and the first chip bump 390, and between the pad layer 271 and the second chip bump 392. The surface treatment layer 275 may prevent formation of an intermetallic compound between the pad layer 271, the first chip bump 390, and the second chip bump 392. In some embodiments, the surface treatment layer 275 may be formed of multiple layers. As an example, the surface treatment layer 275 may be formed of a double layer of gold (Au)/nickel (Ni).

In some embodiments, the redistribution structure 210 may electrically connect the first semiconductor chip 310 and the second semiconductor chip 320. For example, a part of the fourth redistribution pattern 212d may connect the upper pad 270 connected to the first chip bump 390 and the upper pad 270 connected to the second chip bump 392. The first semiconductor chip 310 and the second semiconductor chip 320 may be electrically connected to each other accordingly.

In some embodiments, a second underfill 318 may be formed between the interposer 200 and the first semiconductor chip 310, and a third underfill 328 may be formed between the interposer 200 and the second semiconductor chip 320. The second underfill 318 may fill a space between the interposer 200 and the first semiconductor chip 310, and the third underfill 328 may fill a space between the interposer 200 and the second semiconductor chip 320. Further, the second underfill 318 may cover the first chip bump 390, and the third underfill 328 may cover the second chip bump 392. The second underfill 318 and the third underfill 328 may prevent breakage or the like of the semiconductor chips 310 and 320, by fixing the semiconductor chips 310 and 320 onto the interposer 200. For example, the second underfill 318 and the third underfill 328 may each include an insulating polymeric material, e.g., EMC.

The molding member 400 may be formed on the upper surface of the interposer 200. The molding member 400 may be formed to cover at least a part of the semiconductor chips 310 and 320. For example, the molding member 400 may cover the side surfaces of the first semiconductor chip 310, the side surfaces of the second semiconductor chip 320, the second underfill 318, and the third underfill 328. Although the molding member 400 is shown to expose the upper surface of the first semiconductor chip 310 and the upper surface of the second semiconductor chip 320, the molding member 400 may also cover the upper surface of the first semiconductor chip 310 and the upper surface of the second semiconductor chip 320.

For example, the molding member 400 may include an insulating polymeric material, e.g., EMC. In some embodiments, the first underfill 280, the second underfill 318, and the third underfill 328 may include a substance different from the molding member 400. For example, the first underfill 280, the second underfill 318, and the third underfill 328 may each include an insulating substance having a fluidity superior to the molding member 400. Accordingly, the first underfill 280, the second underfill 318, and the third underfill 328 may be efficiently fill the narrow space between the package substrate 100 and the interposer 200, or between the interposer 200 and the semiconductor the chips 310 and 320.

Referring to FIGS. 1 to 4 and 5B, in the semiconductor package according to some embodiments, the first lower pad 230 may include a plurality of first pad patterns 230A that are spaced apart, e.g., completely separated, from each other. The plurality of first pad patterns 230A may be placed to correspond to the pad regions 230S, e.g., in a one-to-one correspondence.

In detail, at least a part of the first pad pattern 230A may be placed inside each pad region 230S. As described above with reference to FIGS. 1 to 5A, the plurality of first interposer bumps 292 may be placed to correspond to the pad regions 230S. The plurality of first interposer bumps 292 may be connected to correspond to the first pad patterns 230A accordingly.

Figure 5B:
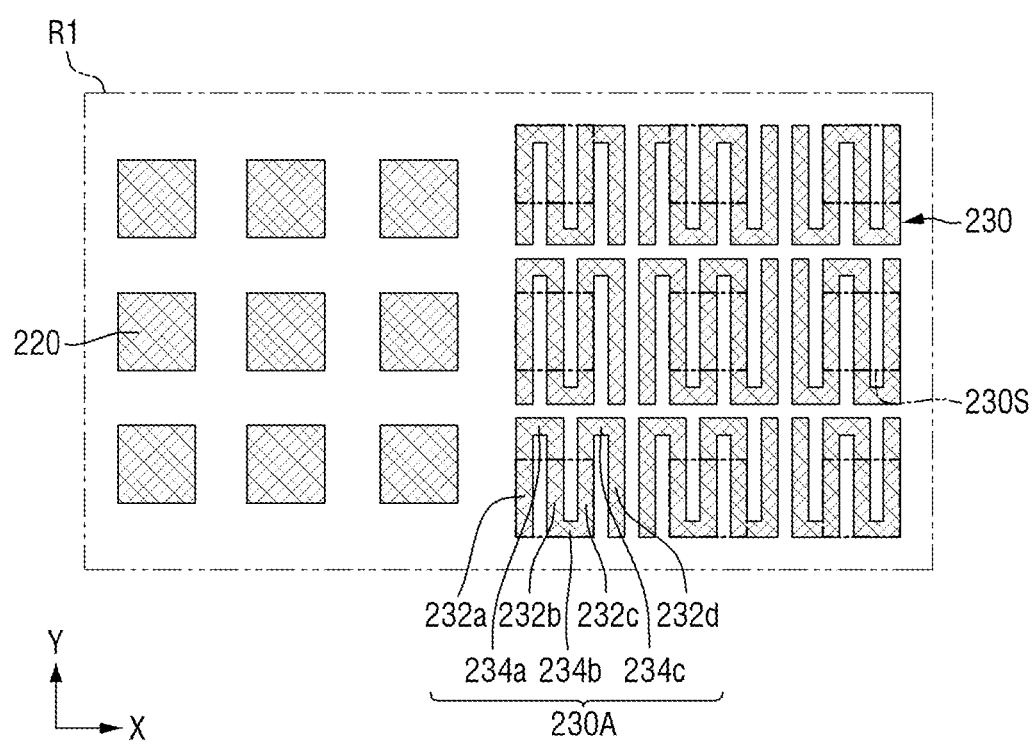

Referring to FIG. 5B, in some embodiments, each first pad pattern 230A may include a plurality of extensions (e.g., first to fourth extensions 232a, 232b, 232c and 232d) and a plurality of connections (e.g., first to third connections 234a, 234b and 234c). For example, as illustrated in FIG. 5B, the first pad patterns 230A may be spaced apart from each other in two direction, and the plurality of extensions (e.g., first to fourth extensions 232a, 232b, 232c and 232d) in each of the first pad patterns 230A may be separated from respective extensions (e.g., first to fourth extensions 232a, 232b, 232c and 232d) of adjacent ones of the first pad patterns 230A. Because the first to fourth extensions 232a, 232b, 232c and 232d and the first to third connections 234a, 234b and 234c are similar to those described above using FIGS. 1 to 5A, detailed description thereof will not be provided below.

Referring to FIGS. 1 to 4 and 5C, in the semiconductor package according to some embodiments, the first lower pad 230 includes a plurality of second pad patterns 230B that are spaced apart, e.g., completely separated, from each other. Each second pad pattern 230B may be formed in a vortex-shaped bent line shape (e.g., a snake shape).

Figure 5C:
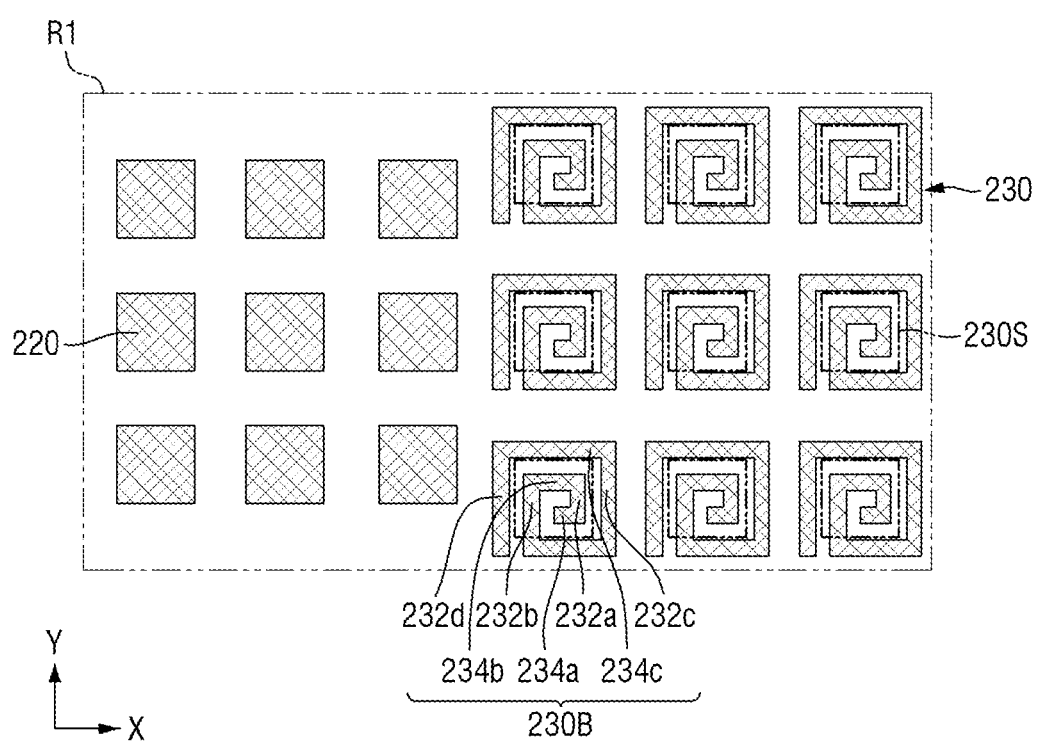
Figure 5D:
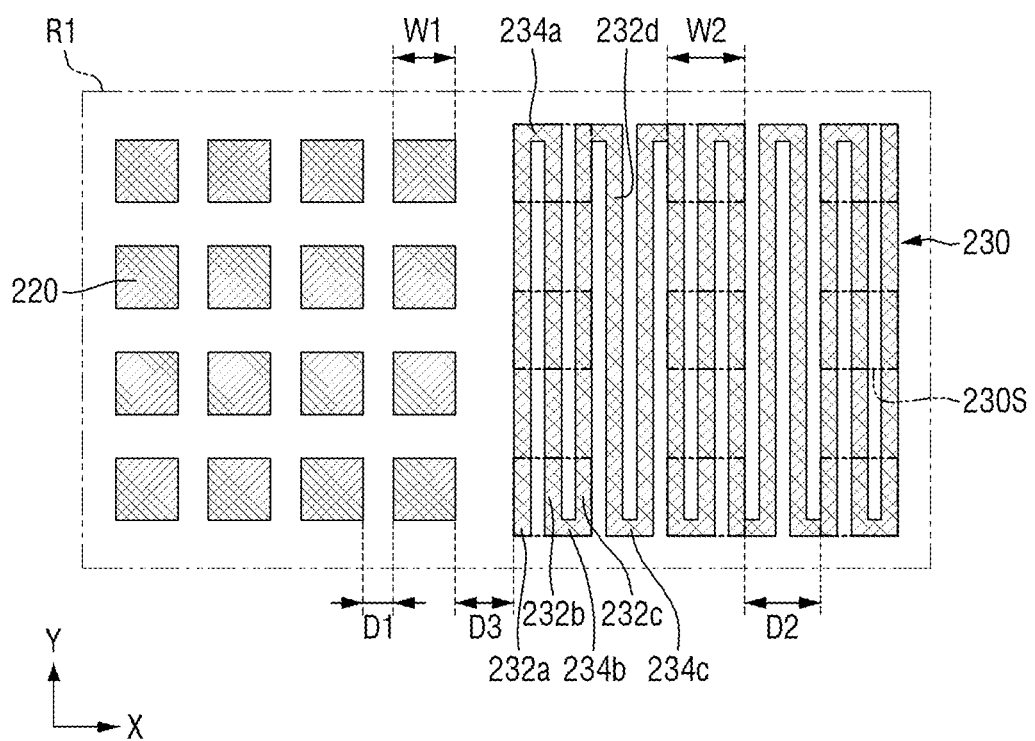

For example, referring to FIG. 5C, each second pad pattern 230B may include a plurality of extensions (e.g., first to fourth extensions 232a, 232b, 232c and 232d) and a plurality of connections (e.g., first to third connections 234a, 234b and 234c). As an example, the first extension 232a may be interposed between the second extension 232b and the third extension 232c, and the second extension 232b may be interposed between the first extension 232a and the fourth extension 232d. At this time, the length of the first to fourth extensions 232a, 232b, 232c and 232d extending in the first direction Y may sequentially increase.

In some embodiments, the plurality of second pad patterns 230B may be placed to correspond to the pad regions 230S, e.g., in a one-to-one correspondence. That is, at least a part of the second pad patterns 230B may be placed inside each pad region 230S. As described above using FIGS. 1 to 5A, the plurality of first interposer bumps 292 may be placed to correspond to the pad regions 230S. Therefore, the plurality of first interposer bumps 292 may be connected to correspond to the second pad patterns 230B.

Referring to FIGS. 1 to 4 and 5D, in the semiconductor package according to some embodiments, the width W1 of each second lower pad 220 is larger than the width W2 of each pad region 230S. For example, the width W2 of each pad region 230S may be about 5 µm or less, e.g., about 2 µm to about 5 µm, while the width W1 of each second lower pad 220 may be larger than 5 µm, e.g., about 10 µm to about 30 µm.

In some embodiments, the spaced distance D2 between the pad regions 230S may be greater than the spaced distance D1 between the second lower pads 220. For example, the spaced distance D2 between the pad regions 230S may be about 5 µm or more, e.g., about 10 µm to about 30 µm.

In some embodiments, the distance D3 of the pad regions 230S spaced apart from the second lower pads 220 may be smaller than the spaced distance D2 between the pad regions 230S. Although the distance D3 of the pad regions 230S spaced apart from the second lower pad 220 is shown as being greater than the spaced distance D1 between the second lower pads 220, this is only an example.

Figure 6:
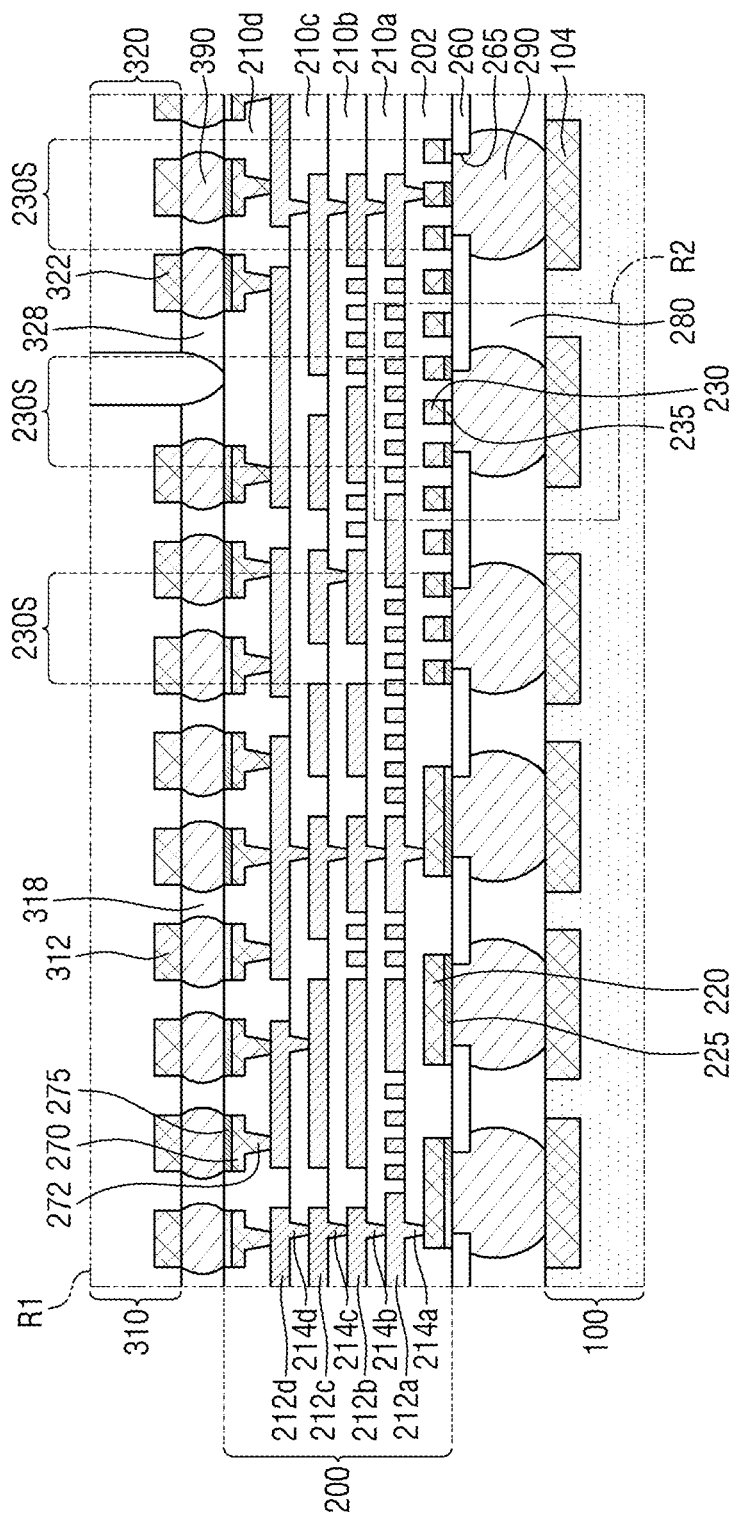
FIG. 6 is another enlarged view of region R1 of FIG. 2.

FIG. 6 is another enlarged view of region R1 in FIG. 2. For convenience of explanation, repeated parts of contents explained above using FIGS. 1 to 5D will be only briefly explained or omitted Referring to FIG. 6, in the semiconductor package according to some embodiments, the first lower pad 230 is connected to the redistribution patterns 212a to 212d. For example, a part of the first redistribution plug 214a may penetrate the pad insulating film 202 to connect the first lower pad 230 to the first redistribution pattern 212a. Accordingly, the first lower pad 230 may be electrically connected to the redistribution structure 210, and may transmit and receive data signals, ground signals or power signals. In some embodiments, the first lower pad 230 may be a ground pad that transmits and receives the ground signals.

Figure 7:
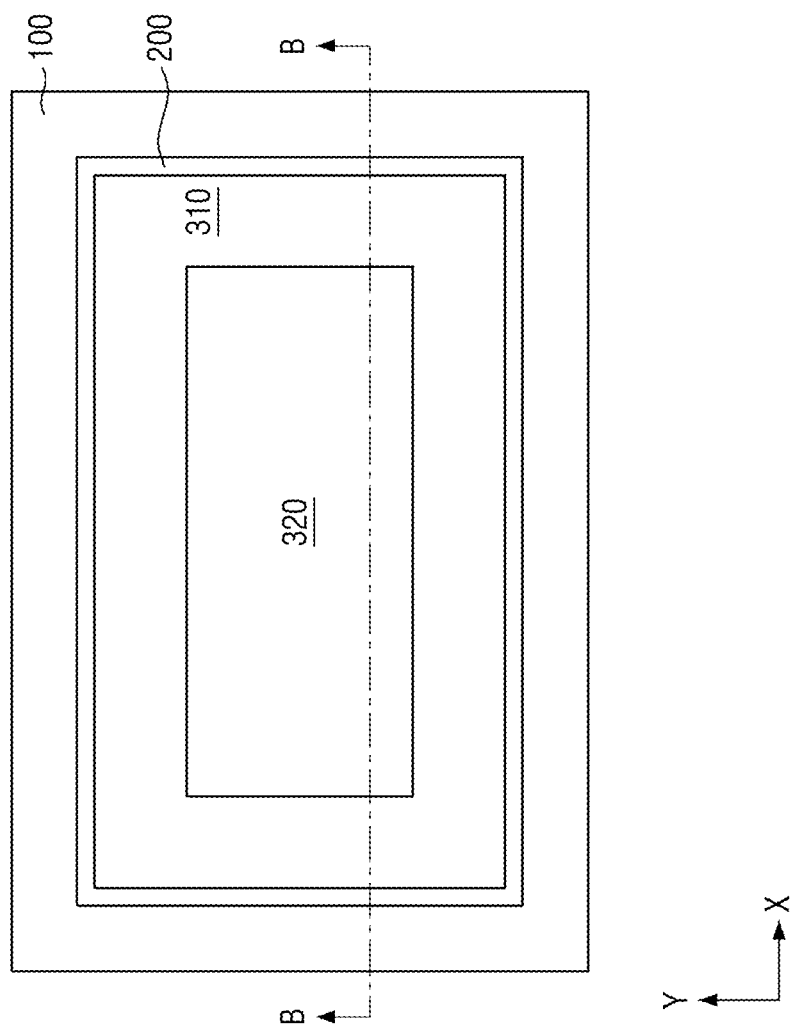
FIG. 7 is an exemplary layout diagram of a semiconductor package according to some embodiments.
Figure 8:
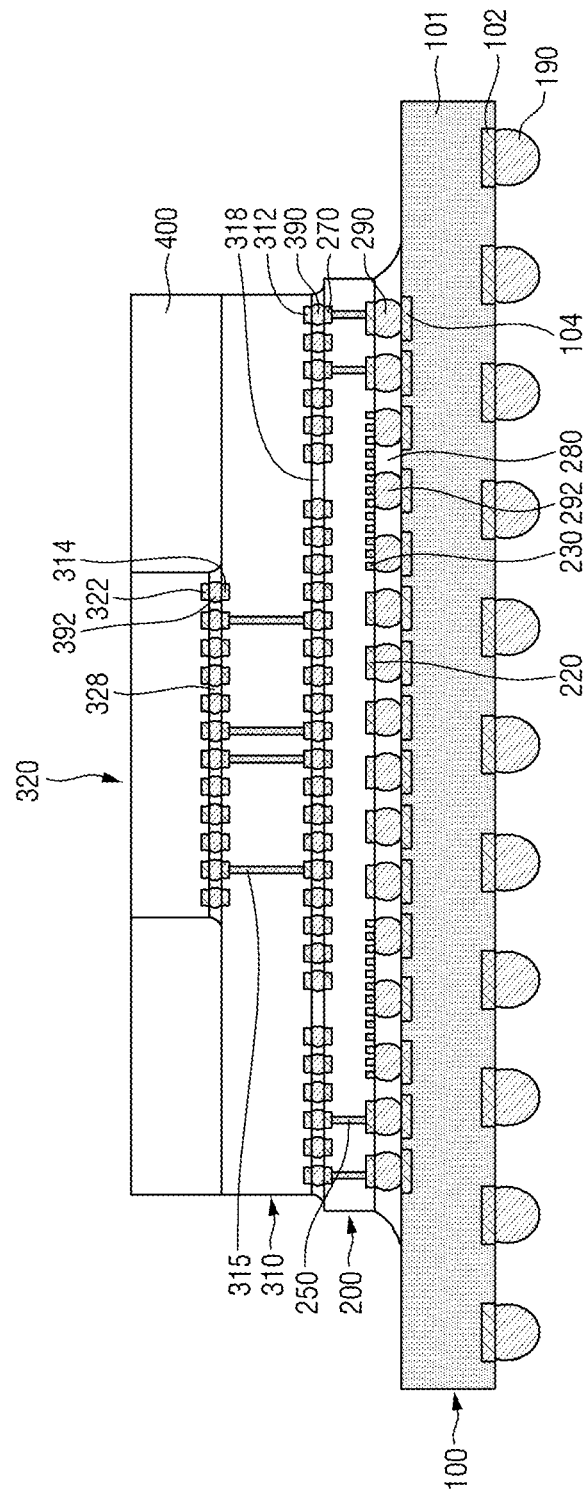
FIGS. 8 and 9 are various cross-sectional views along line B-B of FIG. 7.
Figure 9:
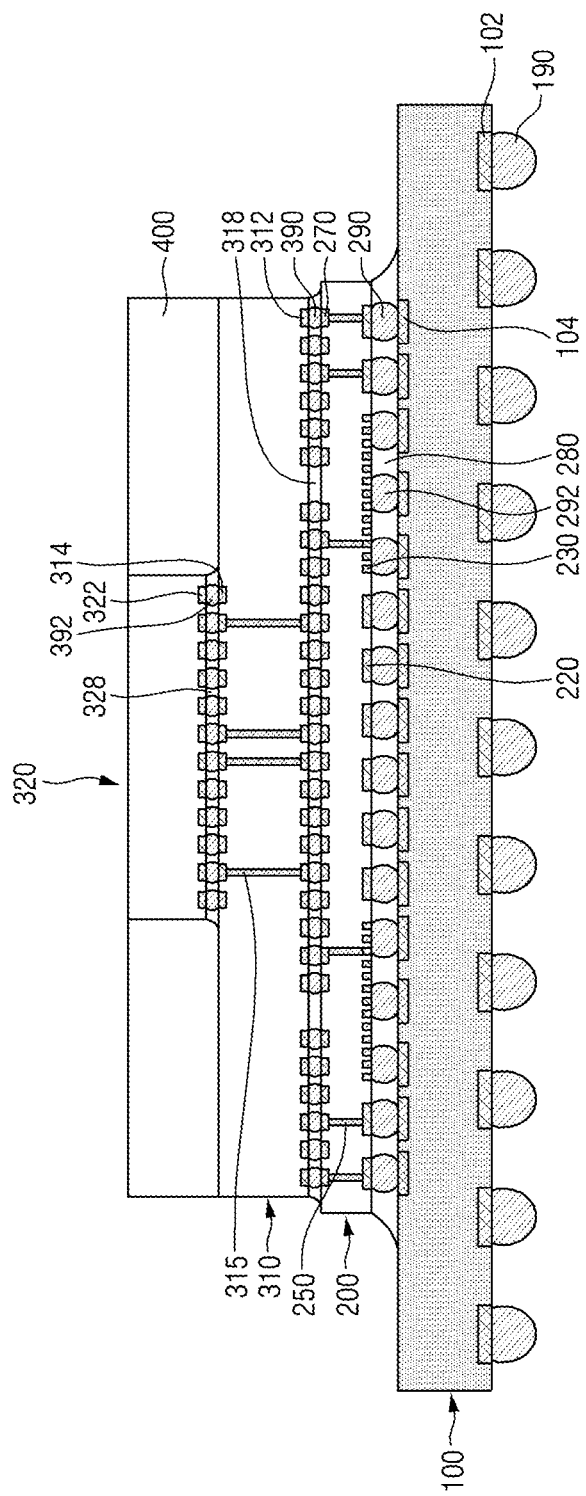

FIG. 7 is an exemplary layout diagram of a semiconductor package according to some embodiments. FIGS. 8 and 9 are various schematic cross-sectional views taken along line B-B of FIG. 7. For convenience of explanation, repeated parts of contents explained above using FIGS. 1 to 6 will be only briefly explained or omitted.

Referring to FIGS. 7 and 8, in the semiconductor package according to some embodiments, the second semiconductor chip 320 is stacked on the first semiconductor chip 310. The second semiconductor chip 320 may be placed on the upper surface of the first semiconductor chip 310. The second semiconductor chip 320 may be mounted on the upper surface of the first semiconductor chip 310.

For example, a third chip pad 314 exposed from the upper surface of the second semiconductor chip 320 may be formed. Further, the second chip bump 392 may be formed between the first semiconductor chip 310 and the second semiconductor chip 320. The second chip bump 392 may connect the third chip pad 314 and the second chip pad 322. The first semiconductor chip 310 and the second semiconductor chip 320 may be electrically connected to each other accordingly.

In some embodiments, the second semiconductor chip 320 may include a chip through via 315. The chip through via 315 may penetrate a base substrate (e.g., a semiconductor substrate) of the second semiconductor chip 320 to electrically connect the first chip pad 312 and the third chip pad 314. The first semiconductor chip 310 may be electrically connected to the interposer 200 accordingly.

In some embodiments, the interposer 200 may include an interposer through via 250. The interposer through via 250 may penetrate the redistribution structure 210 to electrically connect the second lower pad 220 and the upper pad 270. The interposer 200 may be electrically connected to the first semiconductor chip 310 and/or the second semiconductor chip 320 accordingly.

Referring to FIGS. 7 and 9, in the semiconductor package according to some embodiments, at least some of the plurality of interposer through vias 250 are connected to the first lower pad 230. For example, some of the plurality of interposer through vias 250 may penetrate the redistribution structure 210 to electrically connect the second lower pad 220 and the upper pad 270. Some other of the plurality of interposer through vias 250 may penetrate the redistribution structure 210 to electrically connect the first lower pad 230 and the upper pad 270.

Hereinafter, a method for fabricating a semiconductor package according to an exemplary embodiment will be described referring to FIGS. 10 to 23. FIGS. 10 to 23 illustrate cross-sectional views of stages in the method for fabricating the semiconductor package according to some embodiments. FIGS. 11-19 are enlarged views of region R1 in FIG. 10, and FIGS. 21-23 are enlarged views of region R1 in FIG. 20. For convenience of explanation, repeated parts of contents explained above using FIGS. 1 to 9 will be only briefly explained or omitted.

Figure 10:
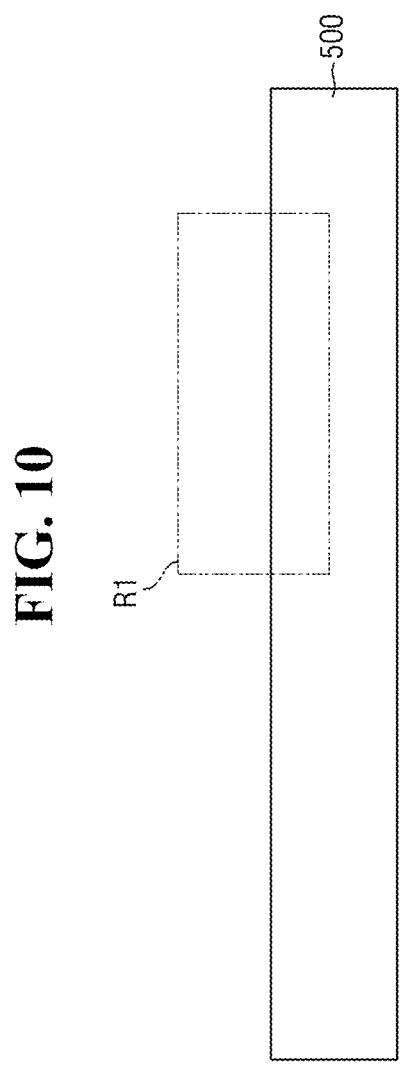
FIGS. 10 to 23 are stages in a method for fabricating a semiconductor package according to some embodiments.
Figure 11:
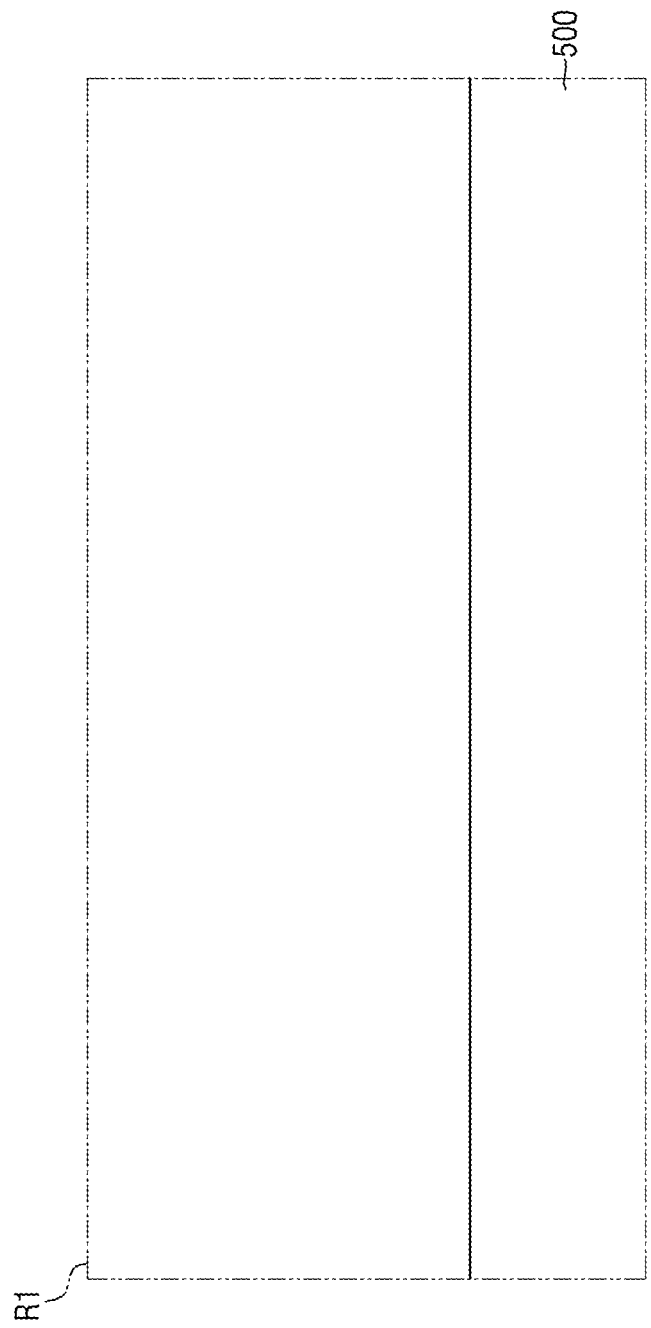

Referring to FIGS. 10-11, a carrier substrate 500 may be provided. For example, the carrier substrate 500 may be a pre-preg including, e.g., glass or insulating resin, an inorganic filler, and a glass fiber. The carrier substrate 500 may be a glass carrier or a normal detach core.

Figure 12:
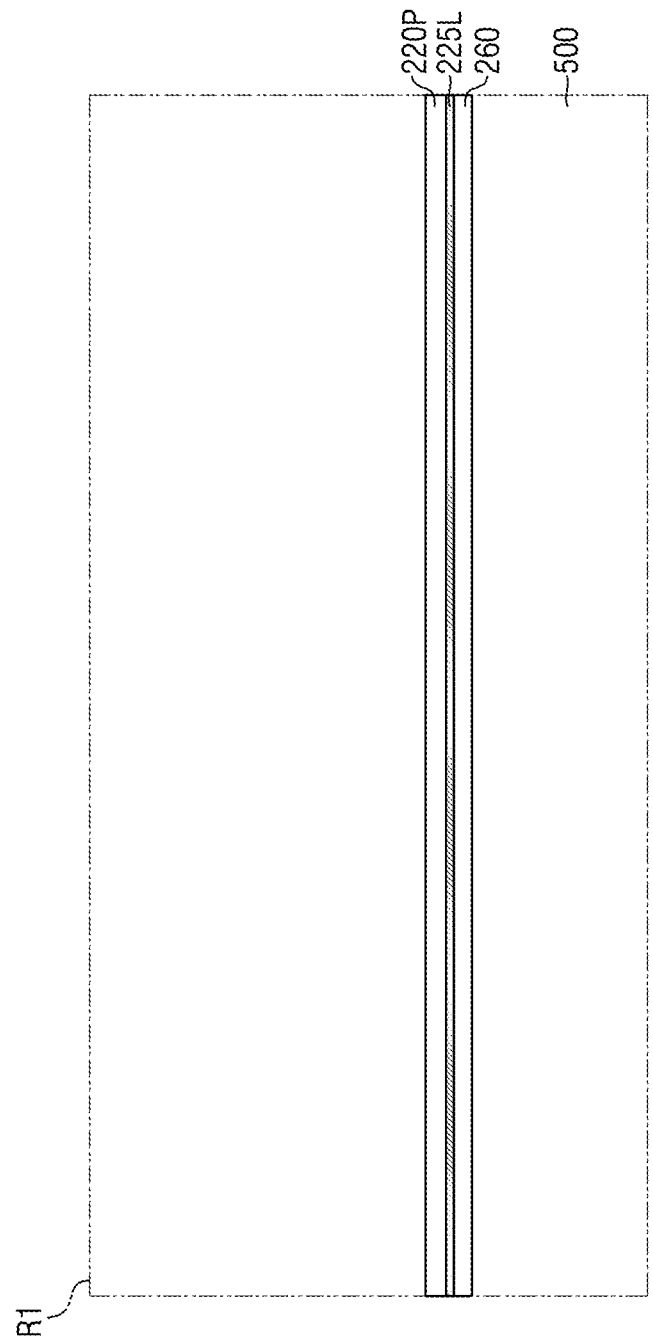

Referring to FIG. 12, a passivation film 260, a first seed film 225L, and a first sacrificial film 220P may be sequentially formed on the carrier substrate 500.

For example, the passivation film 260 may include a thermosetting resin, e.g., an epoxy resin, a thermoplastic resin, e.g., polyimide, or a photosensitive insulating material, e.g., a PID.

The first seed film 225L may function as a seed for formation of first metal patterns 222 and 232 to be described below. In some embodiments, the first seed film 225L may be formed of multiple layers. As an example, the first seed film 225L may be formed of a double layer of titanium (Ti)/copper (Cu).

The first sacrificial film 220P may include, e.g., a photoresist layer or a dry film.

Figure 13:
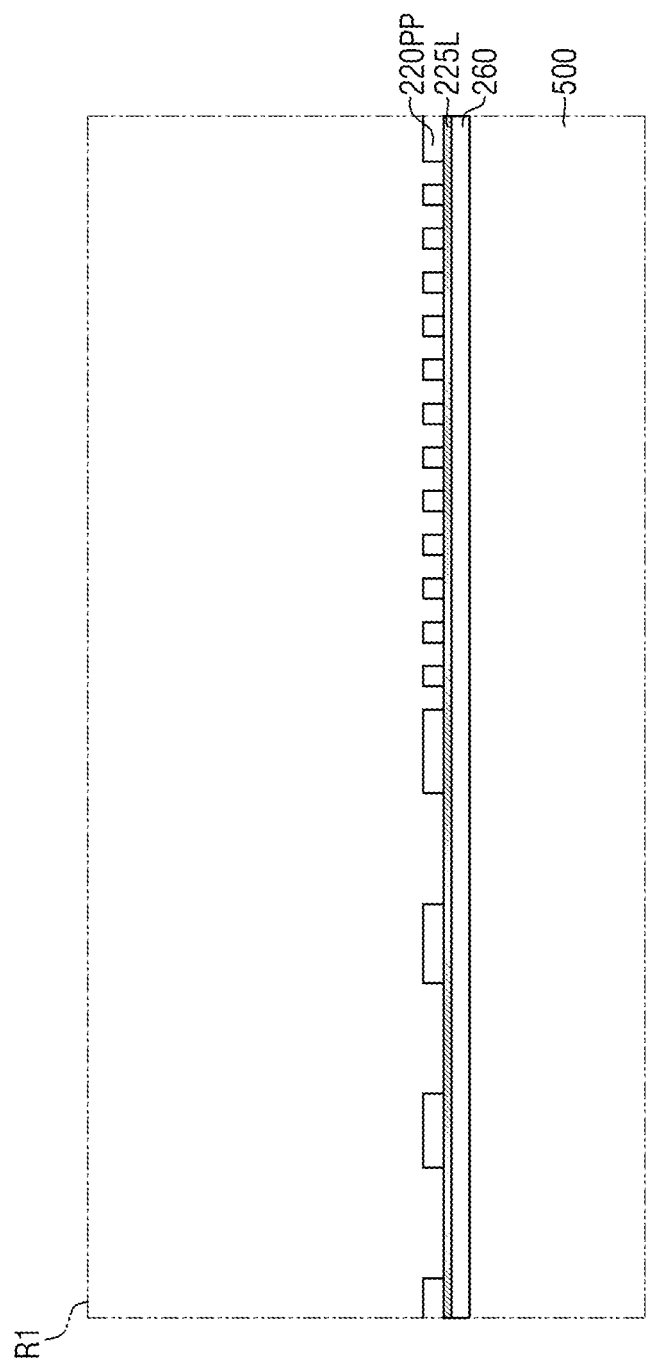

Referring to FIG. 13, the first sacrificial film 220P may be patterned to form first sacrificial patterns 220PP. For example, a photolithography process of patterning the first sacrificial film 220P may be performed. The first sacrificial patterns 220PP that expose a part of the upper surface of the first seed film 225L may be formed accordingly.

Figure 14:
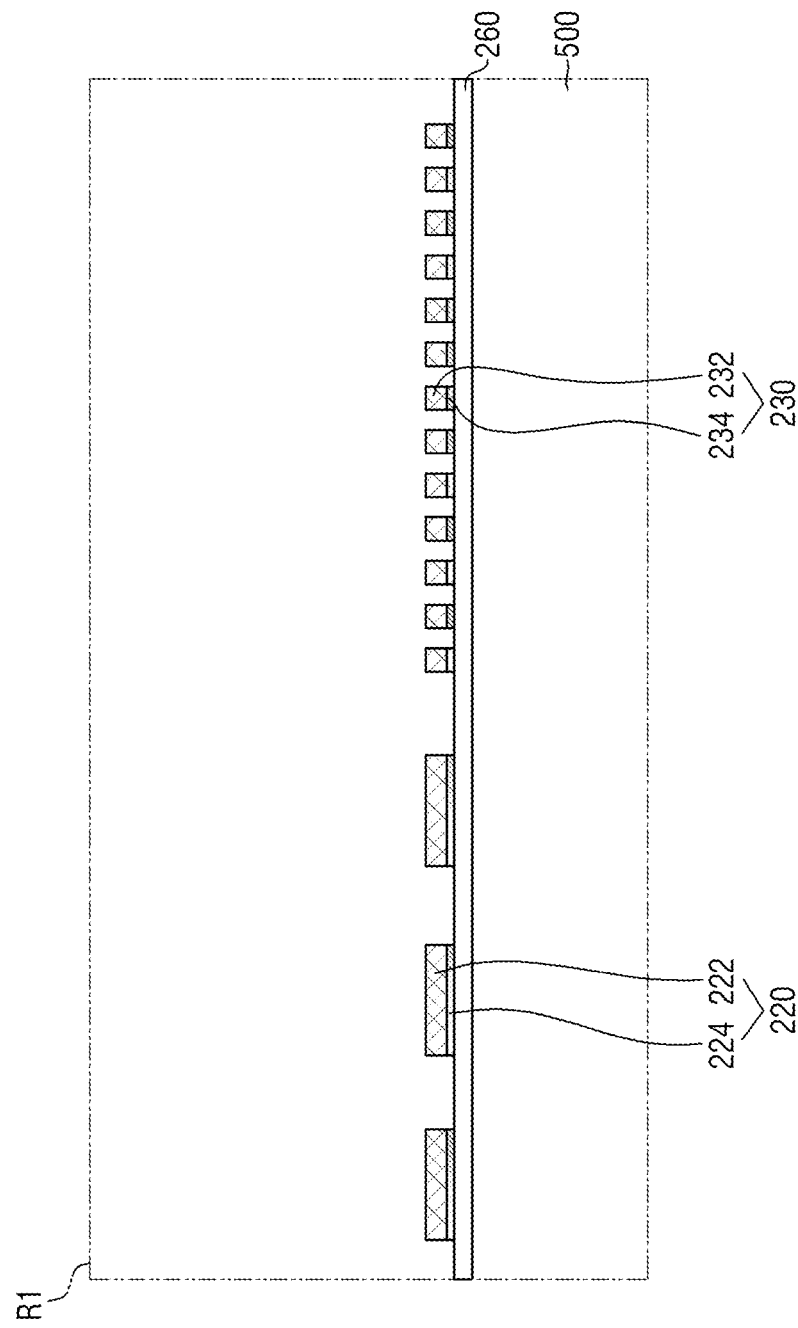

Referring to FIG. 14, first metal patterns 222 and 232 may be formed. For example, an electroplating process which uses the first seed film 225L exposed by the first sacrificial patterns 220PP as a seed may be performed. The first metal patterns 222 and 232 that fill the region between the first sacrificial patterns 220PP may be formed accordingly. After the first metal patterns 222 and 232 are formed, the first sacrificial film 220P may be removed.

The first metal patterns 222 and 232 may include a conductive material, e.g., copper (Cu), aluminum (Al), silver (Ag), tin (Sn), gold (Au), nickel (Ni), lead (Pb), titanium (Ti) or an alloy thereof. Preferably, the first metal patterns 222 and 232 may include copper (Cu).

In some embodiments, the first seed film 225L may be patterned to form the first seed patterns 224 and 234. For example, an etching process which uses the first metal patterns 222 and 232 as an etching mask may be performed. Accordingly, the first lower pad 230 and the second lower pad 220 each including the first seed patterns 224 and 234 and the first metal patterns 222 and 232 may be formed.

Figure 15:
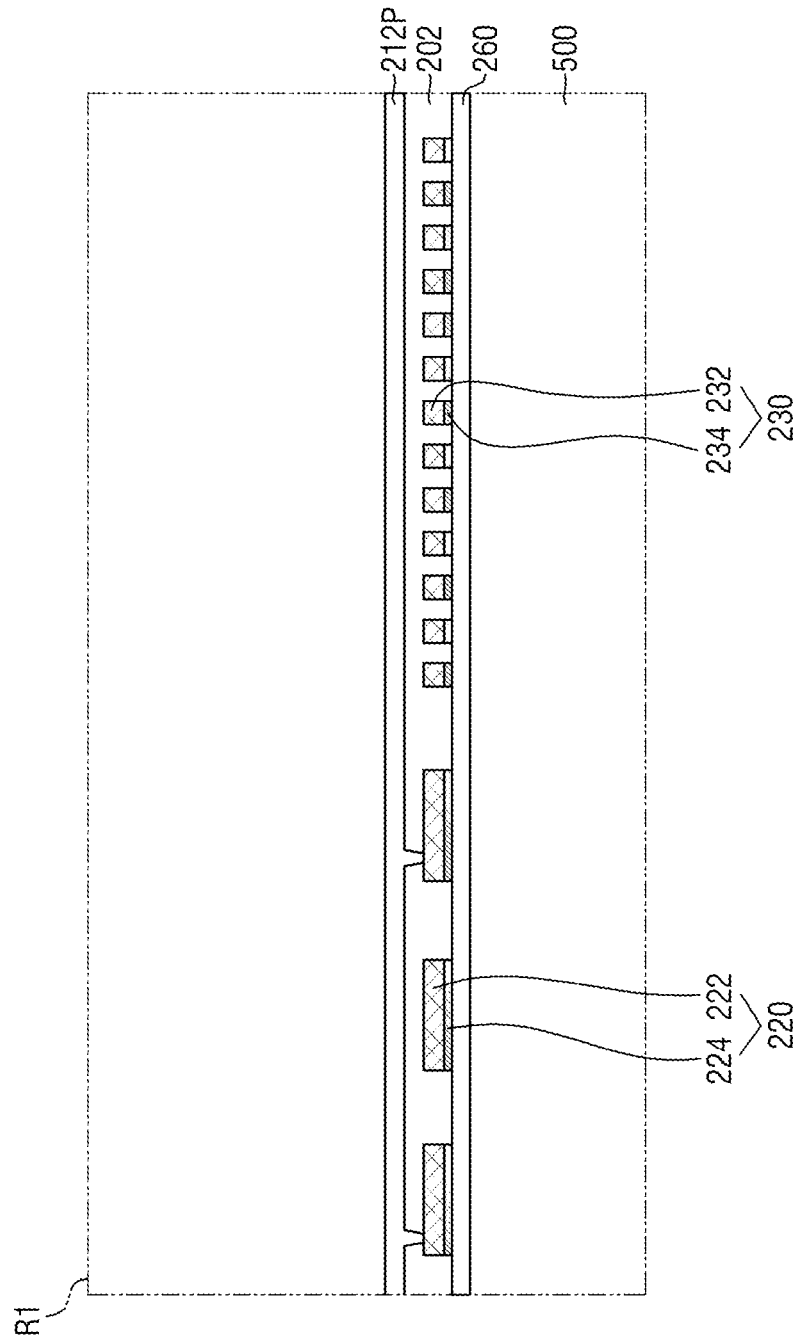

Referring to FIG. 15, the pad insulating film 202 and a second sacrificial film 212P may be formed on the passivation film 260, the first lower pad 230, and the second lower pad 220.

The pad insulating film 202 may cover the passivation film 260, the first lower pad 230, and the second lower pad 220. The pad insulating film 202 may expose a part of the second lower pad 220. For example, the pad insulating film 202 may include a trench that exposes a part of the upper surface of the second lower pad 220. In some embodiments, the pad insulating film 202 may not expose the first lower pad 230.

The second sacrificial film 212P may cover the pad insulating film 202. Further, the second sacrificial film 212P may fill the trench of the pad insulating film 202. The second sacrificial film 212P may include, e.g., a photoresist layer or a dry film.

In some embodiments, a second seed film which covers the pad insulating film 202 may be formed before the second sacrificial film 212P is formed. The second seed film may function as a seed for forming the first redistribution pattern 212a to be described later.

Figure 16:
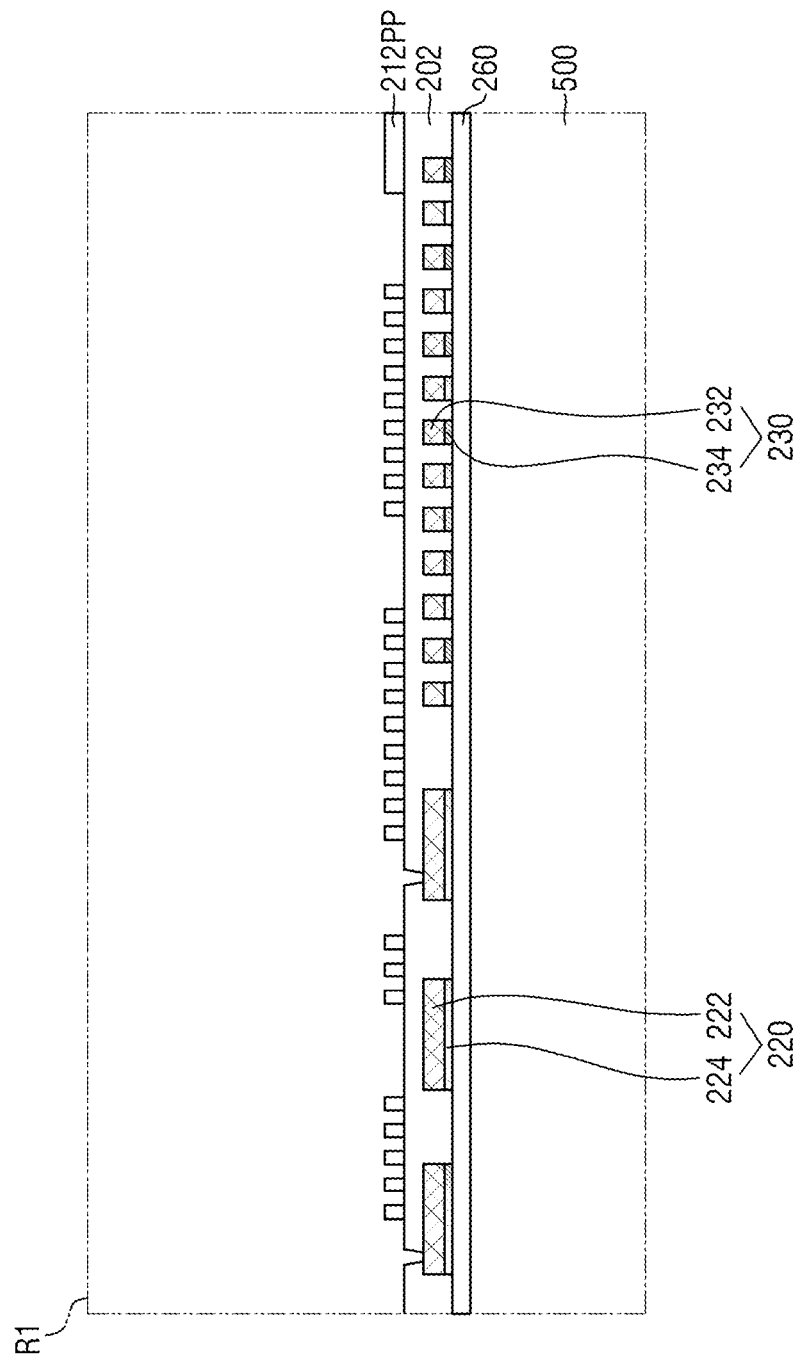

Referring to FIG. 16, the second sacrificial film 212P is patterned to form the second sacrificial patterns 212PP. A photolithography process of patterning the second sacrificial film 212P may be performed. Accordingly, the second sacrificial pattern 212PP that exposes a part of the upper surface of the pad insulating film 202 (or a part of the upper surface of the second seed film) may be formed.

Figure 17:
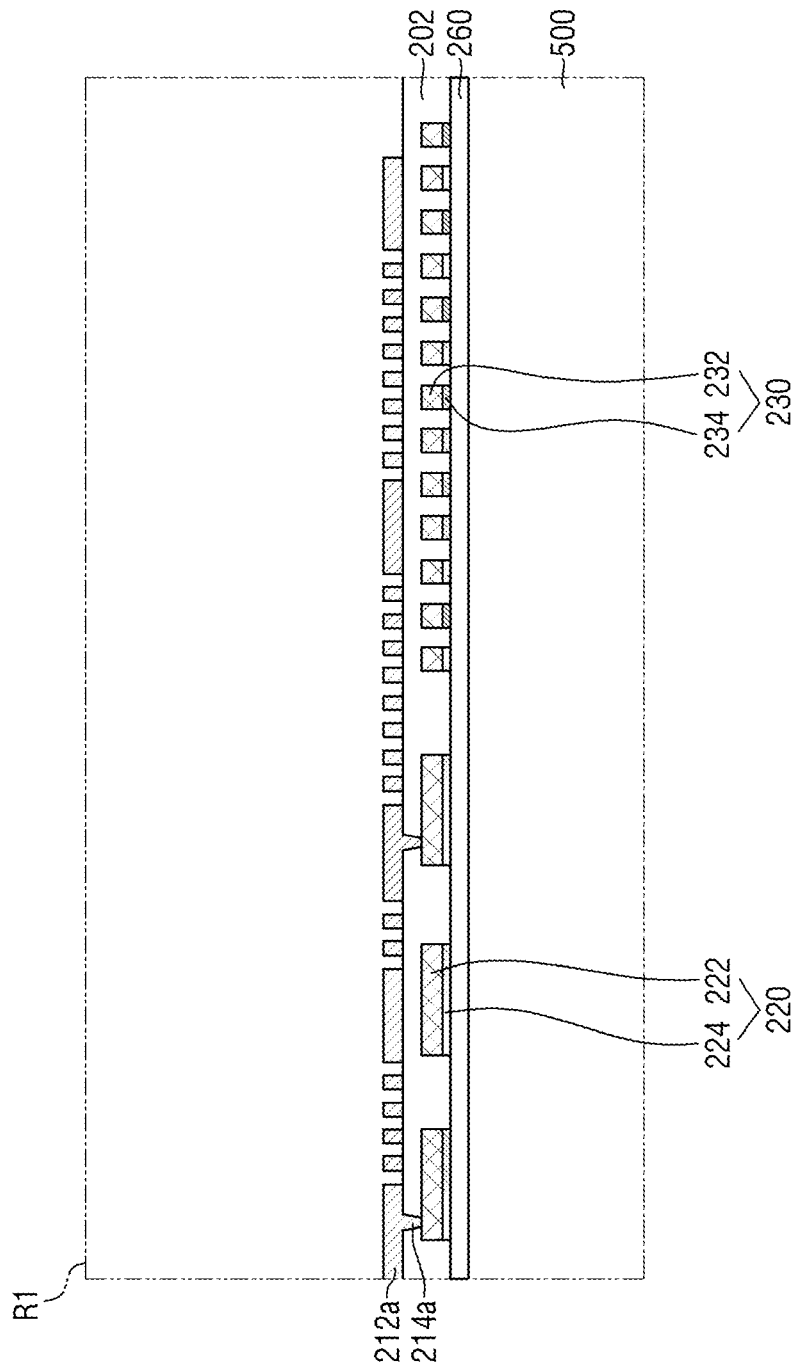

Referring to FIG. 17, the first redistribution pattern 212a and the first redistribution plug 214a are formed. For example, an electroplating process which uses the second seed film exposed by the second sacrificial patterns 212PP as a seed may be performed. Accordingly, the first redistribution pattern 212a that fills the region between the second sacrificial patterns 212PP may be formed. Also, the first redistribution plug 214a that fills the trench of the pad insulating film 202 may be formed.

Figure 18:
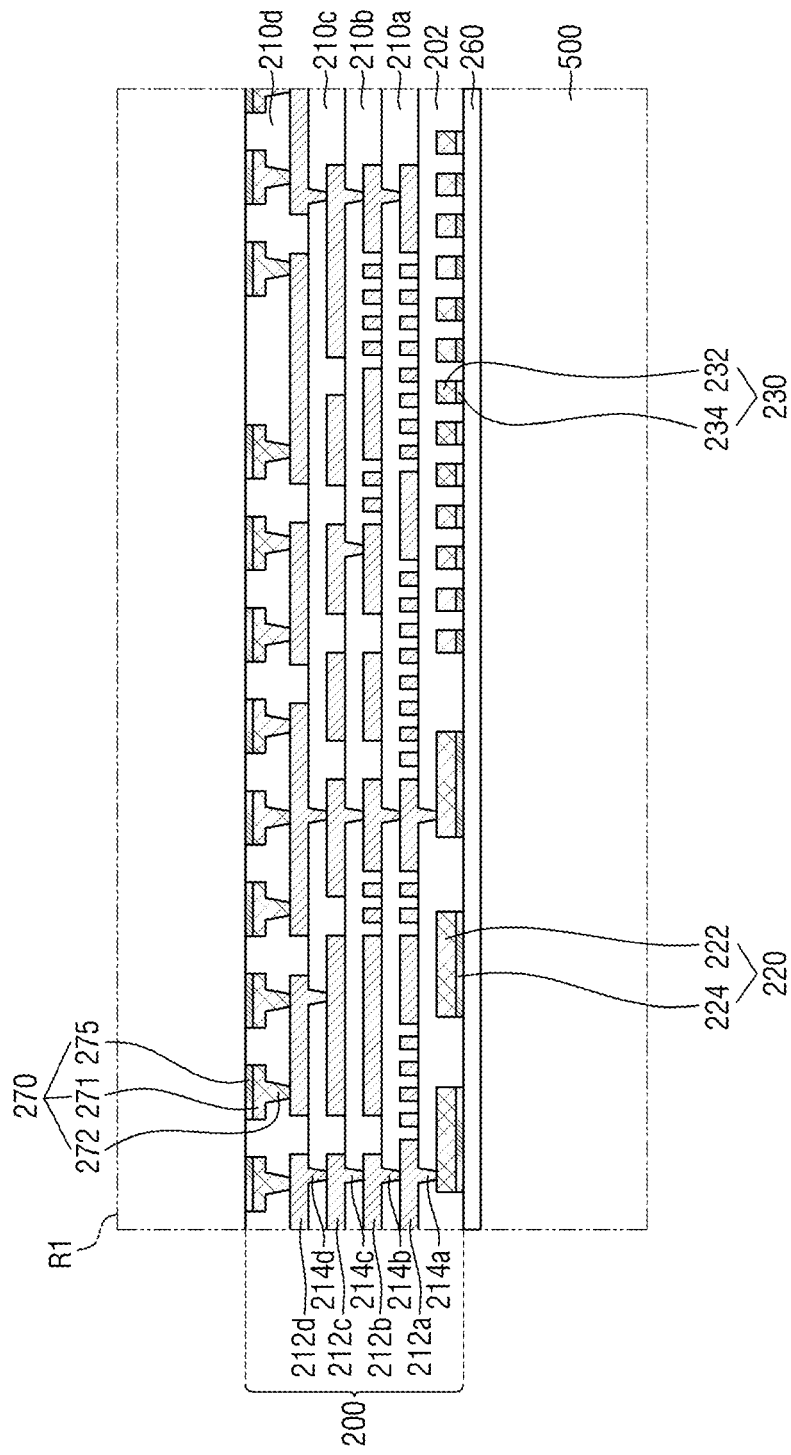

Referring to FIG. 18, the redistribution structure 210 and the upper pad 270 are formed.

For example, the first redistribution insulating film 210a that covers the first redistribution pattern 212a may be formed. The first redistribution pattern 212a, the first redistribution plug 214a, and the first redistribution insulating film 210a may form the first redistribution layer. Subsequently, a plurality of redistribution layers (e.g., second to fourth redistribution layers) may be formed on the first redistribution layer. Because formation of each of the second to fourth redistribution layers is similar to formation of the first redistribution layer (e.g., redistribution insulating films 210a to 210d), detailed description thereof will not be provided below.

Subsequently, the upper pad 270 may be exposed from the upper surface of the redistribution structure 210 (e.g., the fourth redistribution insulating film 210d). In some embodiments, the upper pad 270 may include the pad plug 272, the pad layer 271, and the surface treatment layer 275. The interposer 200 that includes the redistribution structure 210, the first lower pad 230, the second lower pad 220, and the upper pad 270 may be formed accordingly.

Figure 19:
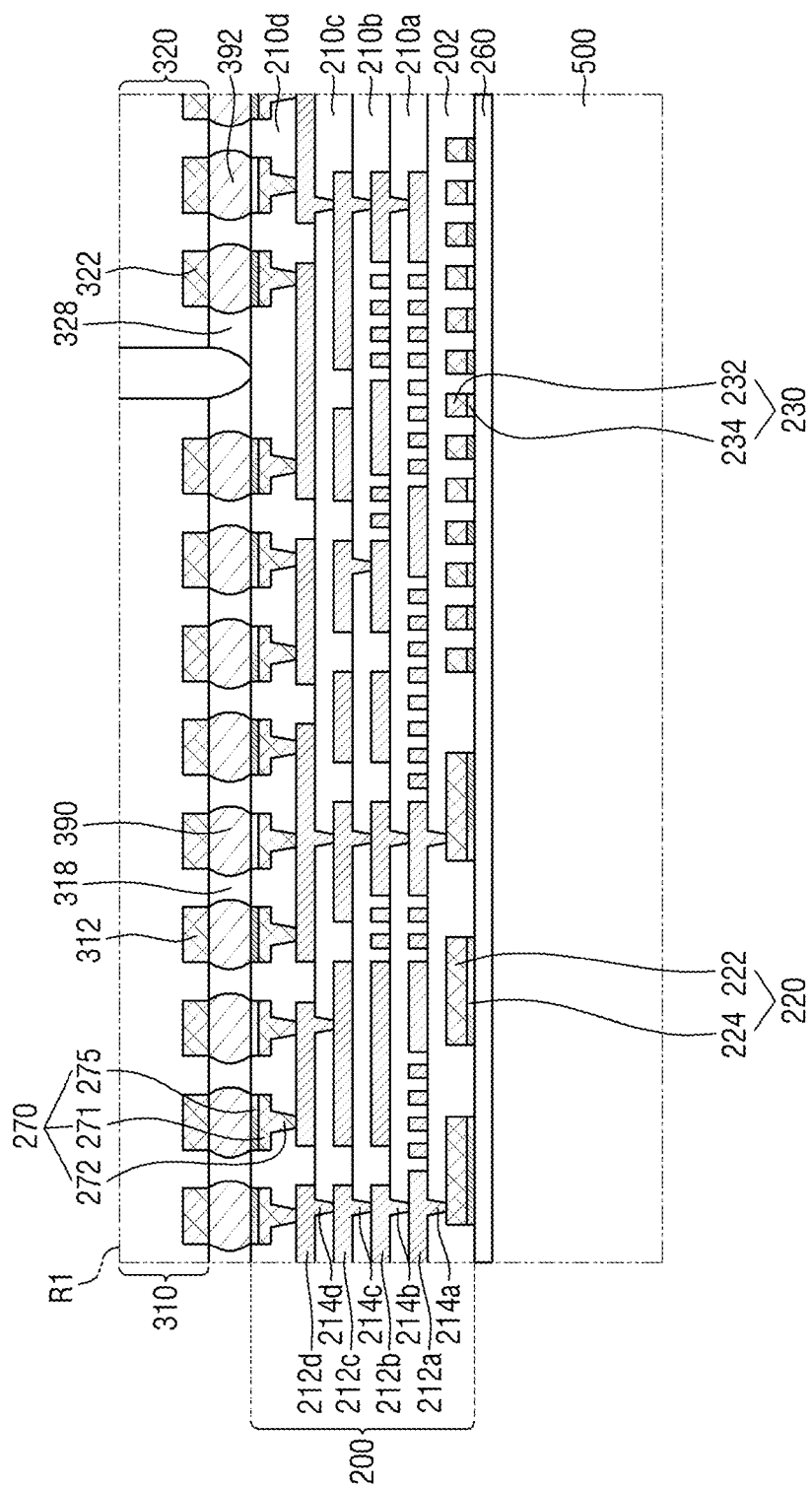

Referring to FIG. 19, the first semiconductor chip 310 and the second semiconductor chip 320 may be formed on the interposer 200. The first semiconductor chip 310 and the second semiconductor chip 320 may be mounted on an upper surface of the interposer 200.

For example, the first chip bump 390 which connects some of the plurality of upper pads 270 and the first chip pad 312 may be formed, and the second chip bump 392 which connects some others of the plurality of upper pads 270 and the second chip pad 322 may be formed. The first chip bump 390 and the second chip bump 392 may each be micro bumps that include low melting point metals, e.g., tin (Sn) and tin (Sn) alloys.

Figure 20:
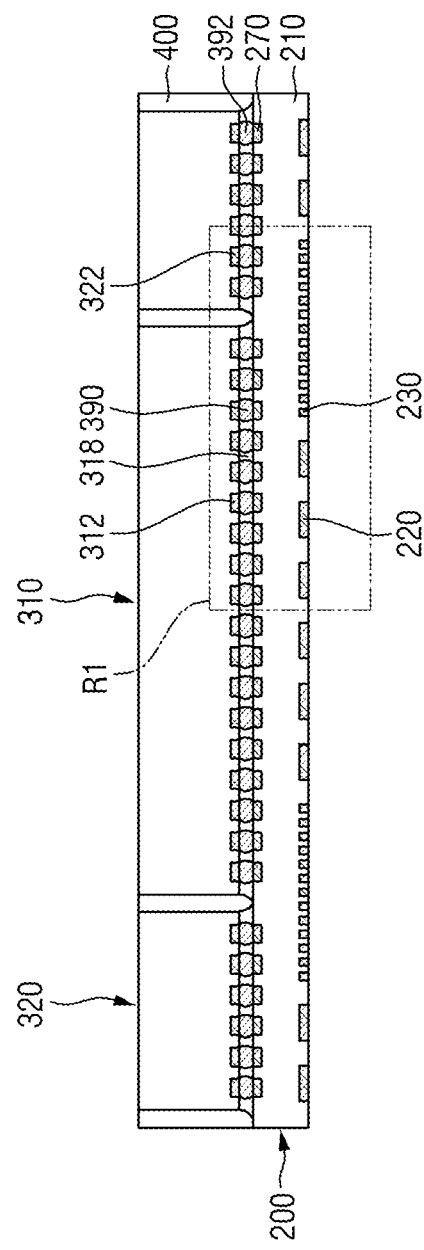
Figure 21:
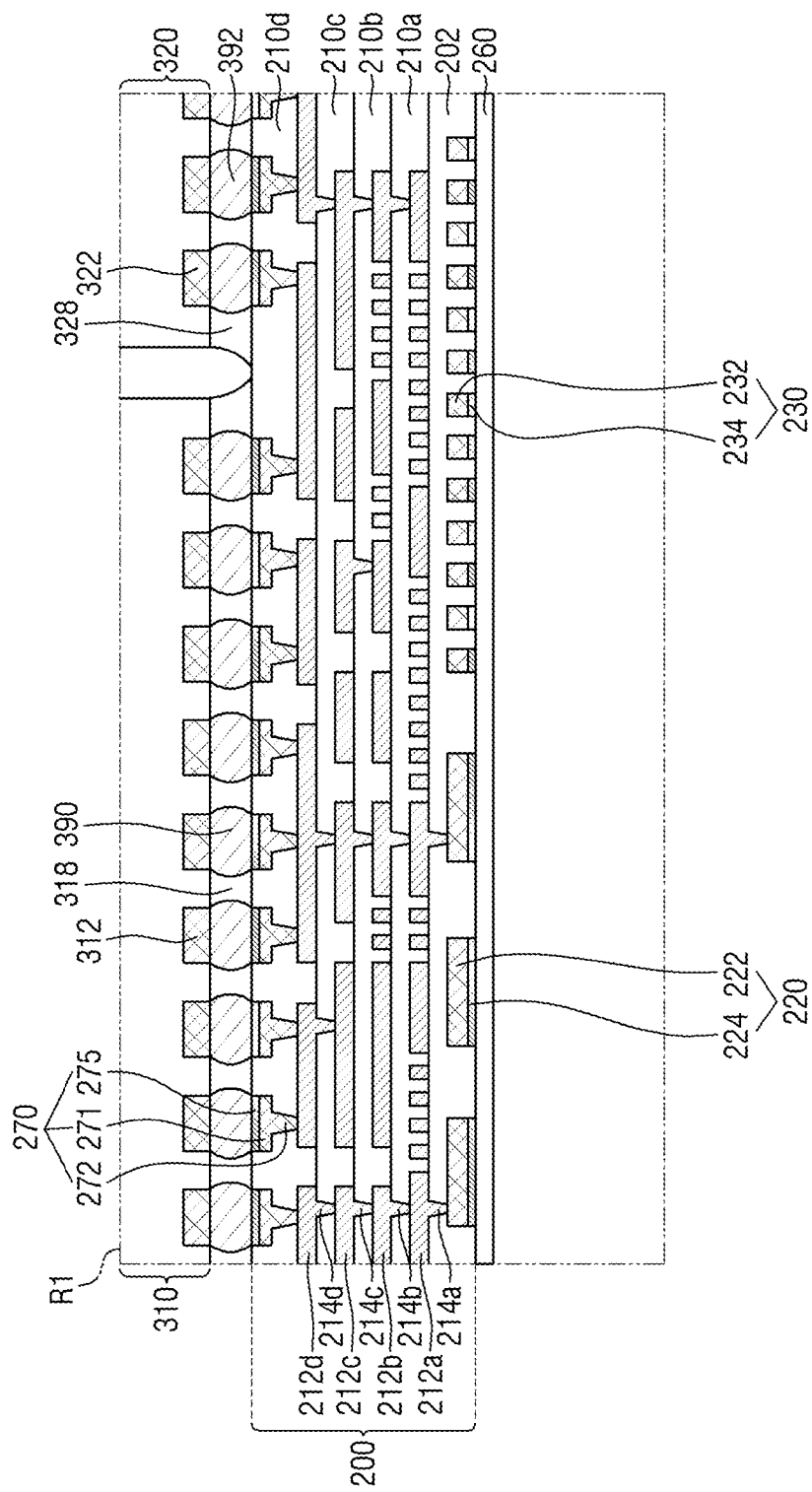

Referring to FIGS. 20 and 21, the carrier substrate 500 is removed. The carrier substrate 500 may be separated from the passivation film 260. A lower surface of the passivation film 260 may be exposed accordingly.

Figure 22:
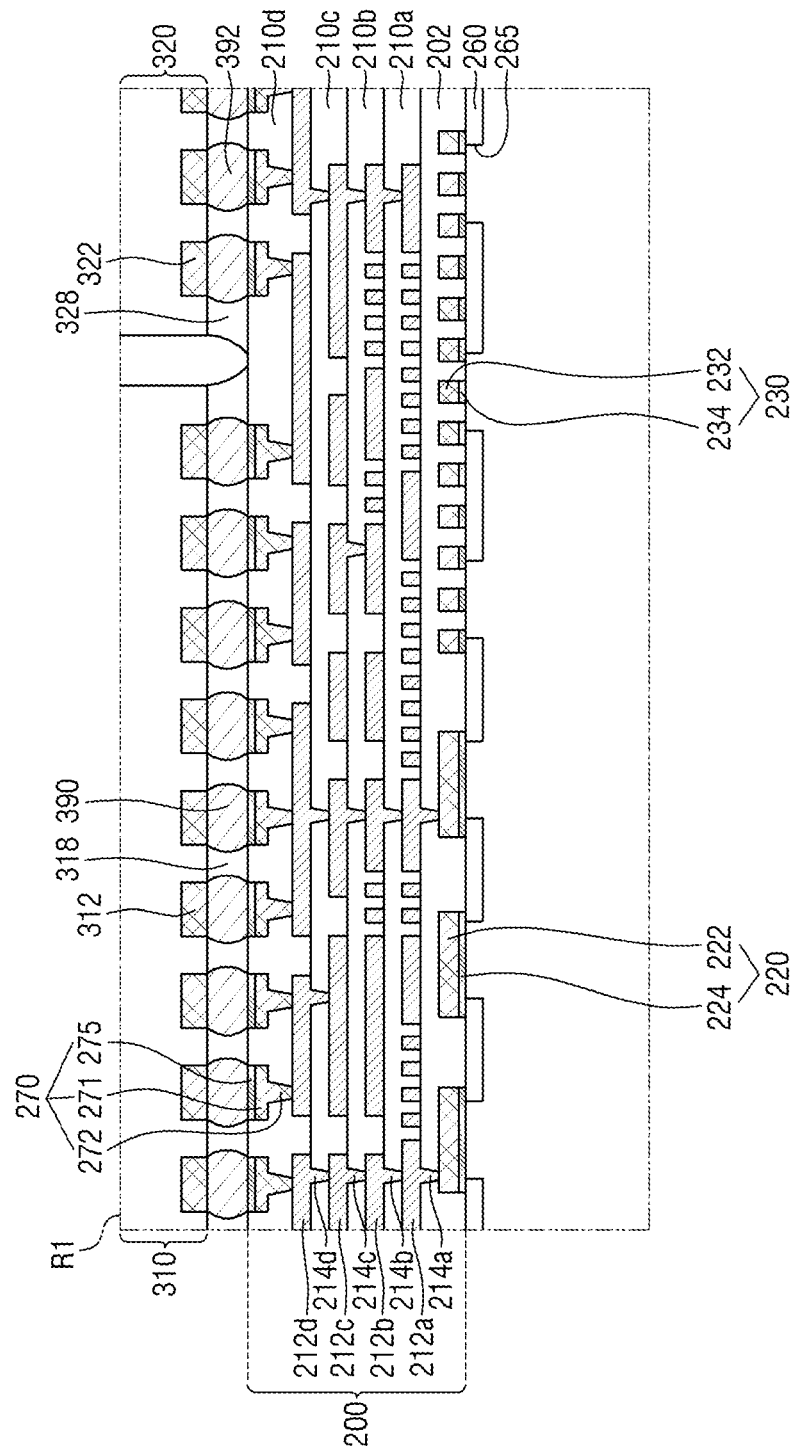

Referring to FIG. 22, at least a part of the first lower pad 230 and/or at least a part of the second lower pad 220 is exposed. For example, the opening 265 that exposes at least a part of the first lower pad 230 and/or at least a part of the second lower pad 220 is formed inside the passivation film 260. At least a part of the lower surface of the first lower pad 230 and/or at least a part of the lower surface of the second lower pad 220 may be exposed through the opening 265.

Figure 23:
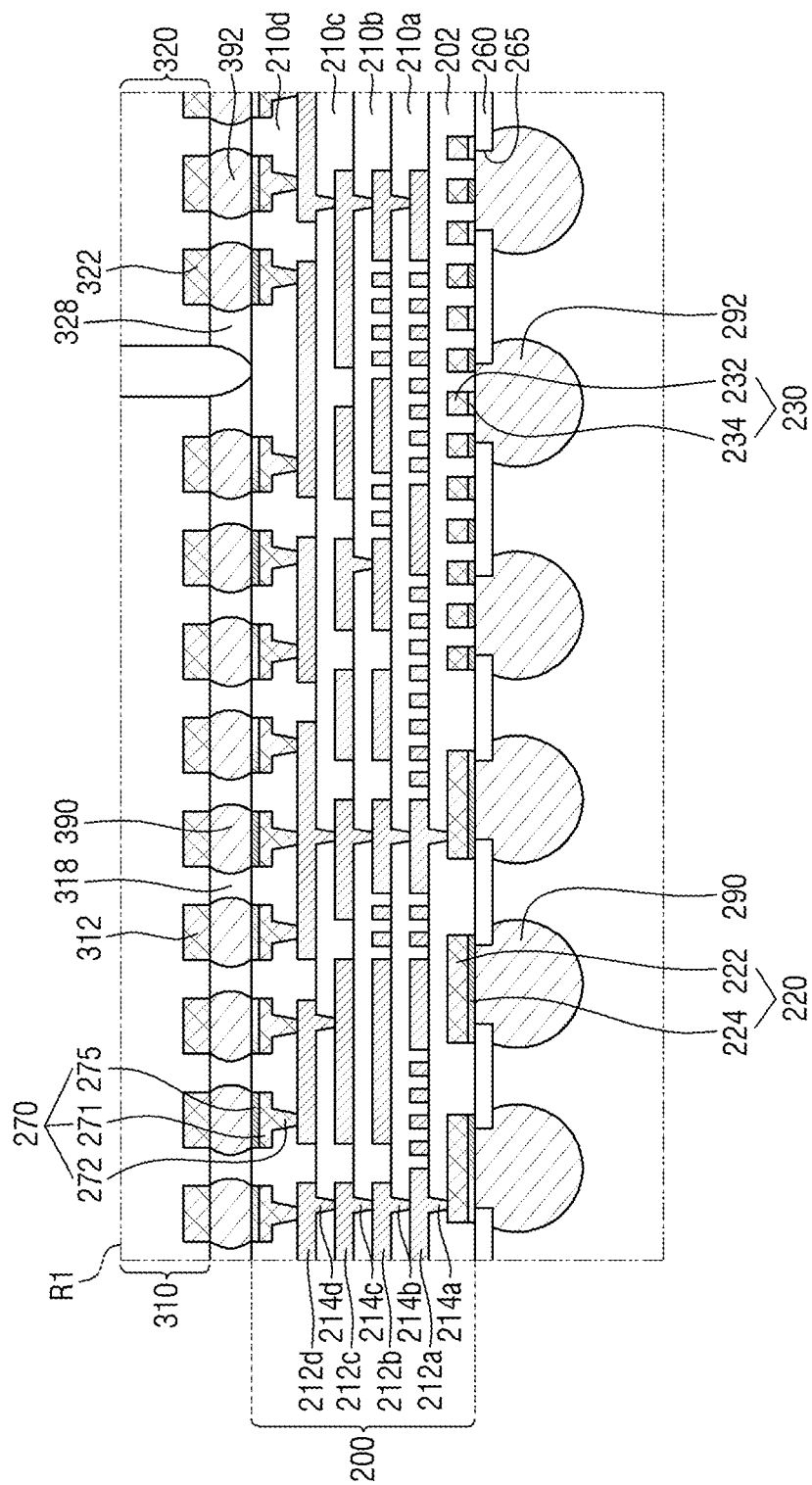

Referring to FIG. 23, the first interposer bump 292 and the second interposer bump 290 are formed. For example, through the opening 265, the first interposer bump 292 may be connected to the first lower pad 230, and the second interposer bump 290 may be connected to the second lower pad 220. The first interposer bump 292 and the second interposer bump 290 may each be, but are not limited to, solder bumps including low melting point metals, e.g., tin (Sn) and tin (Sn) alloys.

Subsequently, referring to FIGS. 2 and 3, the interposer 200 is stacked on the package substrate 100. The interposer 200 may be mounted on the upper side of the package substrate 100. For example, the first interposer bump 292 may connect some of the plurality of second substrate pads 104 to the first lower pad 230, and the second interposer bump 290 may connect some others of the plurality of second substrate pads 104 to the second lower pad 220. The package substrate 100 and the interposer 200 may be electrically connected accordingly.

In general, as semiconductor chips gradually become highly integrated, an interposer having a redistribution layer with a fine pattern is required for signal transmission between the semiconductor chips. However, a redistribution layer with a fine pattern may be damaged during manufacturing, e.g., due to warpage or steps, thereby causing low yield.

For example, if the first lower pads were to be formed without interconnected extensions that are spaced apart from each other, the larger spaced distance D2 between such first lower pads (functioning as dummy pads or ground pads) relative to the spaced distance D1 between second lower pads, would have reduced the flatness of the subsequent process to cause defects. That is, the pad insulating film that fills the gap between the first lower pads would have included undulations between adjacent first lower pads due to the relatively larger distance D2. Such undulation 202CS would have reduced the flatness of the second sacrificial film formed on the pad insulating film, which in turn, would have caused a defect of the first redistribution pattern formed by the use of the second sacrificial film, e.g., delamination or lift of the first redistribution pattern which is a fine pattern.

Further, in another example, if the width W2 of the first lower pad 230 were to be formed to be greater than the width W1 of the second lower pad, the relatively larger width W2 of the first lower pad would have also reduced the flatness of the subsequent process to cause defects. That is, the pad insulating film that covers the upper surface of the first lower pad would have included additional undulations due to the relatively large width W2. The additional undulations would have reduced the flatness of the second sacrificial film formed on the pad insulating film, which in turn, would have caused a defect of the first redistribution pattern formed by the use of the second sacrificial film, e.g., delamination or lift of the first redistribution pattern which is a fine pattern.

In contrast, the first lower pad 230 of the semiconductor package according to example embodiments is formed to have a plurality of interconnected extensions spaced apart from each other (e.g., first to fourth extensions 232a, 232b, 232c and 232d), thereby improving the flatness of the subsequent process. That is, as described above using FIGS. 1 to 5D, the first lower pad 230, e.g., only the first lower pad 230 among the first and second lower pads 220 and 230, may be formed at a relatively small width (e.g., W31) and distance (e.g., D4). Accordingly, it is possible to provide a semiconductor package and a method for fabricating the same, in which the flatness of the subsequent process is improved, e.g., due to the plurality of spaced extensions, and the yield is improved.

On the other hand, a pad formed with a relatively small width may also be vulnerable to twisting, steps, or the like. However, since the first lower pad 230 of the semiconductor package according to example embodiments is formed in a bent line shape (e.g., a snake shape) from a planar viewpoint, it is possible to prevent a lift from the passivation film 260. Specifically, as described above using FIGS. 1 to 5D, the first lower pad 230 may include a plurality of extensions (for example, first to fourth extensions 232a, 232b, 232c and 232d) and a plurality of connections (e.g., first to third connections 234a, 234b and 234c). Accordingly, even though the first lower pad 230 is formed with a relatively small width (e.g., W31), by improving the contact area with the passivation film 260, the degree of adhesion with the passivation film 260 may be improved.

By way of summation and review, as semiconductor chips gradually become highly integrated, an interposer having a redistribution layer with a fine pattern may be required for signal transmission between the semiconductor chips. However, the redistribution layer of the fine pattern may be vulnerable to warpage or steps and a low yield.

In contrast, aspects of embodiments provide a semiconductor package having an improved yield. Aspects of embodiments also provide a method for fabricating a semiconductor package having an improved yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor package, comprising:
an interposer having:
a pad insulating film,
a first lower pad exposed by a lower surface of the pad insulating film, the first lower pad including:

a first extension and a second extension spaced apart from each other, the first extension and the second extension extending side by side in a first direction, and a first connection extending in a second direction intersecting the first direction, the first connection connecting the first extension and the second extension, and a redistribution structure that covers an upper surface of the pad insulating film;

first interposer bumps on a lower surface of the interposer, the first interposer bumps being spaced apart from each other, and at least a part of the first extension and at least a part of the second extension being connected to one of the first interposer bumps; and a first semiconductor chip on an upper surface of the interposer, the first semiconductor chip being electrically connected to the redistribution structure.

2. The semiconductor package as claimed in claim 1, wherein the interposer further includes:

a second lower pad exposed by the lower surface of the pad insulating film, the second lower pad being electrically connected to the redistribution structure; and a second interposer bump on the lower surface of the interposer, the second interposer bump being connected to the second lower pad.

3. The semiconductor package as claimed in claim 1, wherein a width of each of the first extension and the second extension is 2 μm to 5 μm.

4. The semiconductor package as claimed in claim 1, wherein:

the interposer further includes an upper pad exposed by an upper surface of the redistribution structure, and the first semiconductor chip includes a chip pad exposed by a lower surface of the first semiconductor chip, a chip bump connecting the upper pad of the interposer and the chip pad of the first semiconductor chip being positioned between the interposer and the first semiconductor chip.

5. The semiconductor package as claimed in claim 1, further comprising a second semiconductor chip on the upper surface of the interposer, the redistribution structure electrically connecting the first semiconductor chip and the second semiconductor chip.

6. The semiconductor package as claimed in claim 1, wherein the first lower pad further includes:

a third extension which extends side by side along with the second extension in the first direction; and a second connection which extends in the second direction to connect the second extension and the third extension.

7. The semiconductor package as claimed in claim 6, wherein the first connection extends from a first end of the second extension, and the second connection extends from a second end of the second extension.

8. The semiconductor package as claimed in claim 1, wherein:

the redistribution structure includes redistribution layers sequentially stacked on the upper surface of the pad insulating film, and each of the redistribution layers includes a patterned redistribution line redistribution insulating film which covers the patterned redistribution line, and a redistribution plug which penetrates the redistribution insulating film and is connected to the patterned redistribution line.

9. A semiconductor package, comprising:

an interposer having:

a pad insulating film, a first lower pad exposed by a lower surface of the pad insulating film, the first lower pad including:

a first extension and a second extension spaced apart from each other, the first extension and the second extension extending side by side in a first direction, a width of each of the first extension and the second extension being 2 μm to 5 μm, and a distance between the first extension and the second extension being 2 μm to 5 μm, and a first connection which extends in a second direction intersecting the first direction, the first connection connecting the first extension and the second extension, and a first patterned redistribution line extending along an upper surface of the pad insulating film; and a first semiconductor chip on an upper surface of the interposer.

10. The semiconductor package as claimed in claim 9, wherein the interposer further includes second lower pads exposed by the lower surface of the pad insulating film and electrically connected to the first patterned redistribution line.

11. The semiconductor package as claimed in claim 10, wherein:

the lower surface of the interposer includes pad regions spaced apart each other, a distance between the pad regions being greater than a distance between the second lower pads, and at least a part of the first extension and at least a part of the second extension overlap one of the pad regions.

12. The semiconductor package as claimed in claim 11, further comprising:

first interposer bumps which overlap the pad regions on the lower surface of the interposer; and second interposer bumps which overlap the second lower pads, on the lower surface of the interposer.

13. The semiconductor package as claimed in claim 11, wherein a width of each of the pad regions is 10 μm to 30 μm.

14. The semiconductor package as claimed in claim 9, wherein a width of the first connection is the same as the width of each of the first extension and the second extension.

15. The semiconductor package as claimed in claim 9, wherein a thickness of the first lower pad is greater than a thickness of the first patterned redistribution line.

16. The semiconductor package as claimed in claim 9, wherein a width of the first patterned redistribution line is 2 μm to 5 μm.

17. The semiconductor package as claimed in claim 9, wherein the interposer further includes:

a redistribution insulating film which covers the first patterned redistribution line;

a second patterned redistribution line extending along the upper surface of the redistribution insulating film; and a redistribution plug which penetrates the redistribution insulating film and connects the first patterned redistribution line and the second patterned redistribution line.

18. A semiconductor package, comprising:

a package substrate including an insulating core and a substrate pad exposed from-by an upper surface of the insulating core;

an interposer including:
- a redistribution structure on an upper surface of the package substrate,
- a first lower pad exposed by a lower surface of the redistribution structure, the first lower pad including:
  - a first extension and a second extension which are spaced apart from each other, the first extension and the second extension extending side by side in a first direction, and
  - a first connection which extends in a second direction intersecting the first direction, the first connection connecting the first extension and the second extension, and
- an upper pad exposed by an upper surface of the redistribution structure;

a first interposer bump which connects the substrate pad and the first lower pad between the package substrate and the interposer, the first interposer bump being in contact with at least a part of each of the first extension and the second extension;

a first semiconductor chip and a second semiconductor chip on an upper surface of the interposer, the first semiconductor chip including a chip pad exposed fen by a lower surface of the first semiconductor chip; and a chip bump between the interposer and the first semiconductor chip, the chip bump connecting the upper pad to the chip pad.

19. The semiconductor package as claimed in claim 18, wherein the first semiconductor chip is a logic semiconductor chip, and the second semiconductor chip is a memory semiconductor chip.

20. The semiconductor package as claimed in claim 18, wherein:
- the interposer further includes a second lower pad which is spaced apart from the first lower pad and exposed by the lower surface of the redistribution structure,
- a second interposer bump is positioned between the package substrate and the interposer, the second interposer bump connecting the substrate pad and the second lower pad, the first lower pad is a dummy pad or a ground pad, and
- the second lower pad is a signal pad.

* * * * *